United States Patent
Arno et al.

(10) Patent No.: US 6,759,018 B1
(45) Date of Patent: Jul. 6, 2004

(54) METHOD FOR POINT-OF-USE TREATMENT OF EFFLUENT GAS STREAMS

(75) Inventors: Jose I. Arno, Brookfield, CT (US); Mark Holst, Concord, CA (US); Sam Yee, Fremont, CA (US); Joseph D. Sweeney, San Francisco, CA (US); Jeff Lorelli, Fremont, CA (US); Jason Deseve, Sunnyvale, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/212,107

(22) Filed: Dec. 15, 1998

Related U.S. Application Data

(63) Continuation-in-part of application No. 09/086,033, filed on May 28, 1998, and a continuation-in-part of application No. 08/857,448, filed on May 16, 1997, now Pat. No. 5,935,283.

(51) Int. Cl.$^7$ .............................. B01J 8/04; B01J 19/30; B01D 53/40; B01D 53/68; B01D 53/78
(52) U.S. Cl. .................. 423/210; 423/240 R; 423/235; 423/248; 95/223; 95/224; 95/199; 261/21
(58) Field of Search .................... 423/240 R, 242.1, 423/243.01, 235, 210, 248; 95/223, 224, 199; 261/21, 22

(56) References Cited

U.S. PATENT DOCUMENTS

| | | | |
|---|---|---|---|
| 4,005,010 A | | 1/1977 | Lunt .......................... 210/615 |
| 4,029,576 A | | 6/1977 | Shivers ....................... 210/667 |
| 4,029,751 A | * | 6/1977 | Dörr et al. .................. 423/522 |
| 4,147,756 A | * | 4/1979 | Dahlstrom et al. ........... 95/223 |
| 4,213,945 A | * | 7/1980 | Haese et al. ............. 423/240 R |
| 4,328,195 A | * | 5/1982 | Mori et al. ............. 423/240 R |
| 4,344,863 A | | 8/1982 | Robbins et al. ............. 105/908 |
| 4,533,530 A | * | 8/1985 | Hartmann ..................... 95/223 |
| 4,555,389 A | | 11/1985 | Soneta et al. ............... 423/210 |
| 4,980,144 A | | 12/1990 | Koto et al. .................. 356/179 |

(List continued on next page.)

FOREIGN PATENT DOCUMENTS

| JP | 62136230 | 6/1987 |
|---|---|---|
| JP | 06285332 A | 10/1994 |

OTHER PUBLICATIONS

A. J. Teller, "The Rosette, A new packing for diffusional operatioons based on high interstitial holdup" Chemical Engineering Progress, vol. 50, No. 2 pp. 65–71, Feb. 1954.

(List continued on next page.)

*Primary Examiner*—Ngoc-Yen Nguyen
(74) *Attorney, Agent, or Firm*—Steven J. Hultquist; Margaret Chappuls

(57) ABSTRACT

A system for abating undesired component(s) from a gas stream containing same, such as halocompounds, acid gases, silanes, ammonia, etc., by scrubbing of the effluent gas stream with an aqueous scrubbing medium. Halocompounds, such as fluorine, fluorides, perfluorocarbons, and chlorofluorocarbons, may be scrubbed in the presence of a reducing agent, e.g., sodium thiosulfate, ammonium hydroxide, or potassium iodide. In one embodiment, the scrubbing system includes a first acid gas scrubbing unit operated in cocurrent gas/liquid flow, and a second "polishing" unit operated in countercurrent gas/liquid flow, to achieve high removal efficiency with low consumption of water. The scrubbing system may utilize removable insert beds of packing material, packaged in a foraminous containment structure. The abatement system of the invention has particular utility in the treatment of semiconductor manufacturing process effluents.

9 Claims, 13 Drawing Sheets

U.S. PATENT DOCUMENTS

| | | | | |
|---|---|---|---|---|
| 5,338,518 A | | 8/1994 | Marion et al. | 422/211 |
| 5,405,590 A | * | 4/1995 | Macedo et al. | 423/240 R |
| 5,480,557 A | | 1/1996 | Kawasaki et al. | 210/695 |
| 5,569,436 A | * | 10/1996 | Lerner | 423/240 R |
| 5,607,654 A | | 3/1997 | Lerner | 423/240 S |
| 5,620,501 A | | 4/1997 | Tamhankar et al. | 95/92 |
| 5,683,587 A | | 11/1997 | Ferrara et al. | 423/230 |
| 5,779,998 A | | 7/1998 | Tom | 423/240 R |
| 5,814,227 A | | 9/1998 | Pavlis | 210/696 |
| 5,846,275 A | | 12/1998 | Lane et al. | 55/431 |
| 6,019,818 A | * | 2/2000 | Knapp | 95/187 |

OTHER PUBLICATIONS

K.J. Kronenberg, "Magnetized" Aqua Magazine, Aug. 1993.

K.J. Kronenberg, "Magnetized II" Aqua Magazine, Sep. 1993.

"The Biological Effect", SoPhTec® International, Science–Marketing–Technology, Spring 1995, p. 2.

"Magnetic Water Treatment in Agriculture", SoPhTec® International, Science–Marketing–Technology, Spring 1995, p. 3.

"The Influence of Magnetically Treated Water on Ornamental Plants", SoPhTec® International, Science–Marketing–Technology, Spring 1995, p. 4.

"Chemistry–Engineering–Application Prinicples", SoPhTec® International, Science–Marketing–Technology, Spring 1995, p. 5.

"Fuel Conditioning Perspective", SoPhTec® International, Science–Marketing–Technology, Spring 1995, p. 6.

Pontius, F. W. *"Water Quality and Treatment"*, $4^{th}$ Ed., McGraw–Hill 1990, p. 359.

T. Herman et al, "Efficiently handling effluent gases through chemical scrubbing" American Institute of Physics Conference Proceedings 166, Photovoltaic Safety, Denver CO 1988.

Gmelin Handbook, F. Suppl. vol. 2, p. 92–191.

\* cited by examiner

METHOD FOR POINT-OF-USE TREATMENT OF EFFLUENT GAS STREAMS

CROSS-REFERENCE TO RELATED APPLICATIONS

This is a continuation-in-part of U.S. patent application Ser. No. 09/086,033 filed May 28, 1998 in the name of Jose I. Arno for "Apparatus and Method for Point-of-Use Abatement of Fluorocompounds," and is also a continuation-in-part of U.S. patent application Ser. No. 08/857,448 filed May 16, 1997 now U.S. Pat. No. 5,939,283, in the names of Joseph D. Sweeney, et al. for "Clog-Resistant Entry Structure for Introducing Particulate Solids-Containing and/or Solids-Forming Gas Stream to a Gas Processing System."

BACKGROUND OF THE INVENTION

1. Field of the Invention

This invention relates generally to abatement of undesirable components such as fluorine, silane, gaseous fluorides, acid gases, hydride gases and halide gases from effluent streams containing same, and more specifically to the use of systems employing a wet scrubber apparatus and method for abating undesirable components of the aforementioned type in semiconductor manufacturing processes.

2. Description of the Related Art

In point of use wet scrubbing abatement of semiconductor off-gases, various applications require the removal of hydride gas, acid gas, and entrained solids. This is especially true in processes that use or produce $SiH_4$ (silane), $NH_3$ (ammonia), $F_2$ (fluorine), HF (hydrogen fluoride), $SiF_4$ (silicon tetrafluoride), or $COF_2$ (carbonyl fluoride), such as certain CVD (chemical vapor deposition) processes.

In these effluent gas stream treatment applications, the art has typically employed a multiple component scrubbing system. In such a device, the silane and optionally the ammonia are thermally oxidized in one module of the abatement system, and the HF, $F_2$, $SiF_4$, $COF_2$, and optionally $NH_3$ are scrubbed using water in another, separate module. Disadvantages of thermal oxidation include (i) high energy consumption, and (ii) the generation of NOx resulting from the oxidation of ammonia. In addition, high temperature heated modules may accelerate corrosion downstream of the thermal module because the acid gases ($F_2$ and HF) are heated, but not abated in the thermal unit. Typically, a water scrubbing module is located directly downstream from the thermal module. It is in the hot, moist interface region between the water scrubbing unit and the thermal unit that the hot acid gases typically cause corrosion.

There is therefore a compelling need for a simple, reliable abatement device that can effectively treat effluent streams containing gas species of the type mentioned above.

More specifically, concerning fluorocompounds as effluent gas species that are desirably abated in treatment of effluent gas streams containing same, perfluorinated gases are widely used in chip manufacturing to generate in-situ $F_2$ and fluorine radicals using plasma-assisted reactions. These highly reactive species are produced to remove silica from tool chambers or to etch materials such as nitrides, oxides, or polysilicon from wafers. The most commonly used carbon-based perfluorinated species include $CF_4$, $C_2F_6$, and $C_3F_8$. Nitrogen trifluoride ($NF_3$) and sulfur hexafluoride ($SF_6$) are also widely used.

Perfluorinated compounds (PFCs) are also among the strongest greenhouse gases with global warming potentials (GWPs) three and four orders of magnitude higher than $CO_2$. Moreover, PFCs are extremely stable molecules having lifetimes in the atmosphere of thousands of years. Even though the semiconductor industry is not the largest source of PFC emissions, the industry is actively pursuing strategies to reduce PFC emissions and to protect the environment.

Ongoing research to reduce PFC emission levels falls into four categories: optimization, use of alternative chemicals, recovery/recycle techniques, and abatement processes.

Process optimization involves adjusting the operating conditions in the reactor to achieve enhanced PFC conversion within the semiconductor manufacturing tool. Existing non-optimized conditions in the semiconductor manufacturing process result in PFC utilization that varies depending on the specific gas and process used. For instance, oxide etches using a combination of $CF_4$ and $CHF_3$ rank lowest with 15% process efficiency. Tungsten deposition processes are reported to utilize up to 68% of $NF_3$. Recent developments in optimized plasma clean technologies were demonstrated to provide up to 99% $NF_3$ utilization within the semiconductor manufacturing tool.

High PFC conversions inevitably result in the formation of hazardous air pollutants (HAPs). Breakdown products include mostly fluorine ($F_2$) and silicon tetrafluoride ($SiF_4$) gases and to a lesser extent HF and $COF_2$. Destruction of fully fluorinated gases generates considerably augmented HAP yields compared to the initial PFC volumes delivered to the semiconductor manufacturing tool. For instance, assuming stoichiometric conversion of PFCs into $F_2$, a 1 liter per minute (lpm) flow rate of $NF_3$ could potentially produce 1.5 liters per minute (lpm) of $F_2$. The combined exhaust stream of four chambers in a semiconductor manufacturing process system could potentially generate up to 6 standard liters per minute (slm) of fluorine gas resulting in a post-pump effluent concentration of 3% $F_2$ (50 lpm ballast $N_2$ per pump).

These estimated values double with hexafluorinated PFCs (compared to $NF_3$) and are likely to increase in the future with the projected throughputs of 300 mm wafer manufacturing. These estimates represent worse case scenarios and do not account for the short duration and periodic nature of processes using PFCs, the lower concentrations of $F_2$ emissions during initial cleaning stages, and the reduced probability that two or more chambers run PFC cycles synchronized. Nonetheless, such estimates indicate the serious and worsening character of the PFC problem associated with semiconductor manufacturing operations.

The toxic and corrosive nature of fluorinated HAPs pose considerable health and environmental hazards in addition to jeopardizing the integrity of exhaust systems. In particular, the oxidizing power of $F_2$ is unmatched by any other compound used or generated in the semiconductor manufacturing facility, and is far more reactive than other halogens. The large volumes of $F_2$ and other fluorinated hazardous inorganic gases released during optimized plasma processing require the utilization of point of use (POU) abatement technologies in order to minimize potential dangers and to prolong tool operating life.

There are several potential alternative methods for point of use $F_2$ abatement. At high concentrations, fluorine reacts exothermically with all elements except $O_2$, $N_2$, and noble gases. Consequently, a reasonable approach to $F_2$ abatement is to remove this highly active gas using naturally-occurring reactions without adding energy to the system. The main challenges to this potential approach are heat dissipation and forming acceptable by-products.

Alternative fluorine abatement techniques affording potential solutions to the fluorine abatement problem include wet as well as dry reaction techniques, and thermal reaction techniques.

In dry processing, the fluorine gas stream is flowed through a dry bed filled with a reactive material. Suitable dry chemicals would convert $F_2$ into innocuous solids or benign gases without generating excessive heat. This last condition could be a limiting factor especially when large volumes of $F_2$ are involved.

In a thermal reaction approach, thermal abatement units combine reactive materials and $F_2$ inside a reactor heated using fuel or electrical energy. The by-products generated by the thermal abatement of $F_2$ typically include hot acids requiring the use of a post-reaction water scrubber. The removal efficiencies in these post-reaction water scrubber beds are often compromised, inasmuch as the scrubbing efficiency of most acid gases decrease as a function of temperature. In addition, containment of hot concentrated acids requires expensive materials and construction to prevent temperature-enhanced corrosion attack.

In wet processing techniques, advantage is taken of the fact that fluorine gas reacts quickly and efficiently with $H_2O$. The main products of the reaction between water and $F_2$ are HF, $O_2$, and $H_2O_2$. Objections to using water scrubbers include concerns over the formation of unwanted $OF_2$, and the water consumption necessary to achieve acceptable removal efficiencies at high fluorine challenges.

Comparison of the foregoing treatment options shows that wet scrubbing techniques are potentially the most attractive, provided that the $OF_2$ by-product formation and high potential water consumption problems can be resolved.

There is, accordingly, a need in the art for a point of use wet scrubber fluorine abatement system that inhibits the formation of unwanted $OF_2$, that has an acceptable fluorine removal efficiency at high fluorine concentrations and that concurrently minimizes water usage.

Considering now silanes as undesirable components of effluent gas streams that are desirably abated in gas stream treatment, such components as mentioned above are typically removed by thermal oxidation. Water scrubbing removal of silanes has generally not been considered advantageous in comparison to thermal oxidation, because of the very low solubility of silanes in water and their very low reactivity with water. The prior art in some instances has used chemicals such as KOH and NaOH for such scrubbing, but scrubbing silanes with such hydrides generally requires large amounts of the chemical additives and therefore entails substantial operating costs. Chemical scrubbing is described for example in "Efficiently handling effluent gases through chemical scrubbing," T. Herman and S. Soden, American Institute of Physics Conference Proceedings 166, Photovoltaic Safety, Denver, Colo. 1988.

In addition to the foregoing approaches for achieving abatement of silanes, there are commercially available certain devices that effect thermal oxidation of silane prior to final scrubbing of the effluent gas in a water scrubber. These devices, however, suffer from the disadvantage of requiring ignition sources and fuel, or alternatively electricity, for heating. The associated process also tends to be highly exothermic in nature, resulting in excessive temperatures and substantial exhaust gas quenching requirements.

Another problem experienced in abatement of silanes is that ammonia gas may also be present in the effluent gas stream. The concurrent presence of silane and ammonia presents particular difficulty in achieving high levels of abatement of these components.

There is therefore a need in the art for a gas abatement system that can effectively abate silane and ammonia gas when both are simultaneously present in the effluent gas stream.

Accordingly it would be a significant advance in the art to provide a means and method for efficient removal of silanes that avoid the disadvantages of thermal oxidation treatment.

It would also be a significant advance in the art to provide effect removal of silane at ambient or near-ambient temperature levels, or otherwise at temperature conditions that are substantially below those employed in thermal oxidation treatment. There is therefore a need for a "cold combustion" method and apparatus for effecting abatement of silanes by low temperature oxidation thereof.

A further problem that has plagued the use of water scrubbers for the treatment of effluent gas streams is foaming. In certain semiconductor applications, effluent gases can cause foam formation when entering a water scrubber and such foam can cause deleterious effects inside the scrubber. The most serious problem occurs when the foam builds up in such a large quantity as to completely fill the interior volume of the scrubber. When this happens, foam becomes entrained in the gaseous phase and actually can be carried out of the scrubber. Where the foam coalesces on the exhaust pipe surfaces, corrosion can occur. Additionally, foaming can cause cavitation when foam is present in the sump liquor of the scrubber, and the foam thereby can damage the pump that recirculates the scrubbing liquor. Finally, such foaming activity may significantly increase the pressure drop across the scrubber and thereby adversely affect the operation not only of the scrubber and effluent treatment system, but also the operation of upstream semiconductor manufacturing units that are pressure-sensitive in character.

Yet another problem encountered in the operation of water scrubbers for effluent gas treatment is the mineralic content of the water used in the scrubber. In certain locations of the world and the United States, the make-up water supplied to water scrubbers is very hard, i.e., it contains a high concentration of calcium and magnesium and other ionic species. It has been found that when the water scrubber is operating with a pH above about 8.5, the calcium in the water tends to precipitate out as calcium carbonate ($CaCO_3$). This creates a number of problems. One is that $CaCO_3$ adheres to sensitive surfaces within the recirculation pump associated with the scrubber. This can cause the pump to seize up and fail. Another problem is that the $CaCO_3$ deposits build up on the packing surfaces of the scrubber. This in turn causes an increase in pressure drop across the scrubber and a decrease in scrubbing efficiency. Finally, $CaCO_3$ deposits may form in the water lines of the scrubber, causing an increase in pressure drop and therefore a reduction in water flow rate.

Another solids deposition problem of a more general character is the clogging by solids of lines connected to pressure sensing devices in the abatement system. Such lines are used to measure the pressure at the inlet of the abatement unit, to give the facility engineers an indication of whether any clogging is present in the abatement system. The lines (pressure sensing ports) can sometimes become clogged by particulates or by condensable gases in the effluent stream. If solids build up in the sensing line, the reading of the associated pressure sensing device will be inaccurate and may give a false alarm signal causing the abatement system to be shut down.

A related problem is the occurrence of solids deposition in the entry to the water scrubber, which may be attributable to the presence of condensable gases in the effluent gas stream being processed.

It therefore is desirable to minimize or eliminate the incidence of solids formation in the abatement system, to avoid or at least ameliorate the foregoing solids deposition problems.

In the point of use wet scrubbing abatement of semiconductor off-gases, where both acid gas removal and solids removal are required, e.g., in processes that use or produce $Cl_2$, $F_2$, HF, HCl, or $NH_3$, such as metal etch, LPCVD, EPI, and CVD processes, the scrubbing system utilizes a single packed column through which the gas is flowed for treatment. Above the packed column is a spraying mechanism used to wet the packing material with the scrubbing liquor (usually water). The gas may pass downward through the column in the same direction as the falling water (cocurrent), or upward against the falling water (countercurrent). There is an advantage to using a countercurrent design because the water at the gas outlet (column top) is clean and enables maximum scrubbing potential. On the other hand, the water at the gas outlet of a column operated in cocurrent fashion (column bottom) can be saturated with the given acid gas, thereby limiting the scrubbing potential.

Unfortunately, the column size, packing wetting requirements, and effective solids removal demand that a significant water flow rate must pass over the packing in either cocurrent or countercurrent operation. Typical water flow rates through the packing typically will be in excess of 10 gallons/minute. Using such a high flow rate of fresh water is undesirable in terms of cost and also due to the significant consumption of water by the process facility, particularly in regions where water is scarce. The common answer to this dilemma is to use a recirculation pump to recycle used water back to the top of the packed column. The fresh water (make-up) flow rate can then be lowered. However, recirculation decreases the scrubbing efficiency of the scrubber for the aforementioned gas species.

One method used to increase scrubbing efficiency and decrease the fresh make-up water flow rate is to use a chemical injection agent. These materials work by reacting with the solubilized gases, thereby allowing additional gas molecules to enter into the aqueous scrubbing liquor as a result of the maximized mass transfer gradient. However, the use of chemical agents in this approach is costly and can present additional safety concerns.

It would therefore be desirable to provide a scrubbing system for the effective removal of both solids and acid gases, which does not require the use of chemical addition agents. It would also be desirable to provide a scrubbing system for the treatment of effluent gas, which allows for a significant reduction in the required fresh make-up water flow rate as compared to a typical water scrubber that does not employ the use of chemical addition agents.

Accordingly, it is an object of the present invention to resolve the above-discussed problems associated with effluent gas treatment systems of the prior art.

It is another object of the invention to provide an effluent gas treatment system overcoming such problems of the prior art.

It is a further object of the present invention to provide an effluent gas treatment system that employs a water scrubber in a highly efficient manner.

Other objects and advantages of the invention will be more fully apparent from the ensuing disclosure and appended claims.

SUMMARY OF THE INVENTION

The present invention relates to an apparatus and method for abatement of undesirable components from effluent streams containing same.

Such undesirable components may variously include fluorine, silanes, gaseous fluorides, perfluorocarbons, acid gases, hydride gases and halide gases. Specific examples of such gas components include, without limitation, $SiH_4$ (silane), $NH_3$ (ammonia), $F_2$ (fluorine), HF (hydrogen fluoride), $SiF_4$ (silicon tetrafluoride), and $COF_2$ (carbonyl fluoride).

The invention relates more specifically to effluent gas treatment systems employing a wet scrubber apparatus and method for abating undesirable components of effluent gas streams deriving from semiconductor manufacturing operations.

In one aspect, the present invention relates to a scrubbing system for the abatement of a gas component in a gas stream containing same, such scrubbing system comprising a gas/liquid contacting chamber including means for introducing to the contacting chamber the gas stream and a scrubbing liquid for gas/liquid contacting therein, and additionally at least one of the features of:

(a) a chemical injector for introducing a chemical reagent for contact with the gas component to remove same from the gas stream in said gas/liquid contacting, optionally in combination with a back pressure inducing device, e.g., an orifice to prevent or at least partially reduce foaming in the scrubbing system incident to chemical reagent injection;

(b) an inlet arranged for introduction to the gas stream flowed therethrough of a gas to enhance removal of silane from the gas stream when present therein;

(c) a second gas/liquid contacting chamber receiving a treated gas stream from the first gas/liquid contacting chamber and including means for introducing to said second contacting chamber a second scrubbing liquid for gas/liquid contacting therein, wherein the first gas/liquid contacting chamber is constructed and arranged for cocurrent flow of the gas stream and scrubbing liquid and wherein the second gas/liquid contacting chamber is constructed and arranged for countercurrent flow of the gas stream and the second scrubbing liquid;

(d) an antifoam agent injector for introducing to scrubbing liquid for said gas/liquid contacting a foam-suppressing antifoam agent, to suppress foam production in the scrubbing chamber, optionally in combination with a back pressure inducing device, e.g., an orifice to prevent or at least partially reduce foaming in the scrubbing system incident to antifoam agent injection;

(e) means for suppressing deposition of calcium carbonate from scrubbing liquid containing calcium, said suppressing means being selected from the group consisting of:
  (1) a magnetization zone for imposing a magnetic field on scrubbing liquid prior to use thereof in the contacting chamber;
  (2) means for adjusting the pH of the scrubbing liquid to maintain pH thereof below 8.5;
  (3) a lime-soda ash bed arranged for flow of the scrubbing liquid therethrough prior to use of the scrubbing liquid in the contacting chamber; and
  (4) a precipitator for precipitating the calcium content of the scrubbing liquid prior to use of the scrubbing liquid in the contacting chamber;

(f) means for suppressing solids formation in a passage of the scrubbing system, selected from the group consisting of means for flowing a purge gas through the passage to suppress solids formation therein, and means for heating the passage to suppress solids formation therein; and (g) means for abating silane from the gas stream when present therein in combination with ammonia, such means being selected from the group consisting of:
  (1) means for heating the gas stream prior to introduction of same to the scrubbing system; and
  (2) a second gas/liquid contacting chamber according to (c) hereof, and means for introducing clean dry air or other oxygen-containing gas to the treated gas stream from the first gas/liquid contacting chamber prior to introduction thereof to the second gas/liquid contacting chamber.

Another aspect relates to a scrubbing system including an inlet structure for introducing to a scrubbing apparatus a gas stream containing a silane component. In such aspect, the gas stream is flowed through the inlet structure, and the inlet structure includes means for introducing a gas to the gas stream to enhance removal of the silane component in the scrubbing system. The gas may comprise clean dry air (or any other suitable oxygen-containing gas). The gas may be introduced to the silane containing gas stream in any suitable manner, e.g. bubbling into tipover water in a water overflow inlet structure, or bubbling into flowing water introduced through a dip tube, through holes in a diptube, through a porous diptube, or weeping through pores in a top or side wall of the entry, or introduced through the sidewall of the inlet tubing.

The gas introducing means in one embodiment may for example comprise (i) an upper inlet portion with an annular gas introduction passage including a gas-permeable wall bounding a gas flow passage of the upper inlet portion, and through which the silane-removal-enhancing gas may be flowed, (ii) a lower inlet portion including an annular overflow liquid reservoir with an inner wall having an inner wall surface bounding a gas flow passage through the lower inlet portion of the inlet structure, and producing on overflow a falling film of liquid on the inner wall surface and (iii) a gas inlet tube extending into the gas flow passage and terminating at a lower end in one of the upper inlet and lower inlet portions of the gas introducing means; wherein said gas introducing means is constructed and arranged to introduce silane-containing gas from a source thereof to the scrubbing apparatus.

In another specific embodiment, the gas for enhancing removal of the silane component is introduced to a flow passage of an inlet receiving the silane-containing gas stream, wherein the gas is introduced to the silane-containing gas stream at a central part as well as an outer peripheral part of the gas stream containing silane, so that the silane-abating gas, e.g., clean dry air or other oxygen-containing gas, is intimately mixed with the gas stream to effect cold combustion removal of the silane component, by oxidation thereof.

The aforementioned arrangement may be utilized in combination with a wetted-wall inlet structure of a type as more fully described hereinafter.

A still further aspect of the invention concerns a scrubbing system for treatment of an effluent gas including acid gas components and water-scrubbable components other than acid gas components. Such scrubbing system comprises:

a first scrubber unit for scrubbing the effluent gas with an aqueous scrubbing liquid to remove the acid gas components thereof, said first scrubber unit being constructed and arranged for co-current flow contacting of the aqueous scrubbing liquid and effluent gas with one another to yield effluent gas reduced in acid gas components, as well as water-scrubbable components other than acid gases, as well as water-reactive gases;

a second scrubber unit for scrubbing the effluent gas with a second aqueous scrubbing liquid to remove residual acid gas components and water-scrubbable components other than acid gas components thereof as well as water-reactive components, said second scrubber unit being constructed and arranged for counter-current flow contacting of the second aqueous scrubbing liquid and effluent gas with one another to yield effluent gas reduced in acid gas components and water-scrubbable components other than acid gas components as well as water-reactive components; and means for flowing the effluent gas reduced in acid gas components from the first scrubber unit to the second scrubber unit.

In the above-described scrubbing system, the acid gas components and water-soluble/water-reactive components will be reduced in the first scrubber unit to concentrations approaching those corresponding to the respective equilibrium values of the acid gas components and water-soluble/water-reactive components in the aqueous scrubbing liquid.

A yet further aspect of the invention involves a gas/liquid contacting article, for removable installation in a scrubber vessel having means for introducing a gas and liquid to an interior volume of the scrubber vessel for gas/liquid contacting therein, such packing medium assembly comprising a fluid-permeable containment structure, e.g., a foraminous bag and a mass of packing elements contained in such fluid-permeable containment structure.

As used herein, the term "foraminous" means perforate or otherwise including openings, interstices, vias, or other passages or open space which affords the structure the ability to accommodate fluid flow therethrough. The open space in the foraminous structure may be varied depending on the size of the packing elements to be contained therein.

The invention in a further aspect relates to a scrubbing process for the abatement of a gas component in a gas stream containing same, said scrubbing process comprising introducing the gas stream and a scrubbing liquid to a gas/liquid contacting chamber and effecting gas/liquid contacting therein, wherein said process additionally at least one of the steps of:

(a) introducing a chemical reagent for contact with the gas component to remove same from the gas stream in said gas/liquid contacting;

(b) introducing to the gas stream prior to entry thereof into the contacting chamber, a gas to enhance removal of silane from the gas stream when present therein;

(c) flowing the effluent gas from the contacting chamber to a second gas/liquid contacting chamber and introducing to said second contacting chamber a second scrubbing liquid for gas/liquid contacting therein, wherein the first gas/liquid contacting in the first chamber comprises cocurrent flow of the gas stream and scrubbing liquid and wherein the second gas/liquid contacting in the second contacting chamber comprises countercurrent flow of the gas stream and the second scrubbing liquid through the second contacting chamber;

(d) introducing an antifoam agent to scrubbing liquid for said gas/liquid contacting, to suppress foam production in the contacting chamber, optionally in combination with inducing a back pressure on the scrubbing liquid to supress form production in the contacting chamber, (e) suppressing deposition of calcium carbonate from scrubbing liquid containing calcium, including a step selected from the group consisting of:

(1) imposing a magnetic field on scrubbing liquid prior to use thereof in the contacting chamber;
(2) adjusting the pH of the scrubbing liquid to maintain pH thereof below 8.5;
(3) flowing the scrubbing liquid through a lime-soda ash bed prior to use of the scrubbing liquid in the contacting chamber; and
(4) precipitating the calcium content of the scrubbing liquid prior to use of the scrubbing liquid in the contacting chamber; and (f) suppressing solids formation in a passage of the scrubbing system, including a step selected from the group consisting of flowing a purge gas through the passage to suppress solids formation therein, and heating the passage and/or gas flowed therethrough to suppress solids formation therein.

In another aspect, the invention relates to a process for abatement of fluorocompound from an effluent stream containing same, including contacting the gas stream with an aqueous medium in the presence of a reducing agent, such as sodium thiosulfate, ammonium hydroxide, potassium iodide, or any other suitable reducing agent.

In a further aspect, the invention relates to an apparatus for abatement of fluorocompound in an effluent stream containing same, including a water scrubber unit joined in flow relationship with the stream of fluorocompound-containing effluent and arranged for discharge of a fluorocompound-depleted effluent stream, with means for injecting a reducing agent such as sodium thiosulfate, ammonium hydroxide, potassium iodide, or the like into the water scrubber unit to abate the fluorocompound therein and provide an enhanced extent of removal of the fluorocompound, relative to a corresponding system lacking such reducing agent injection.

A still further aspect of the invention relates to a semiconductor manufacturing facility, comprising:
 a semiconductor manufacturing process unit producing an effluent gas stream containing a fluorocompound; and
 an apparatus for abating fluorocompound in the effluent gas stream, comprising:
  a water scrubber unit for gas/liquid contacting;
  means for introducing the fluorocompound-containing effluent gas stream to the water scrubber unit;
  means for discharging a fluorocompound-reduced effluent gas stream from the water scrubber unit; and
  a source of a reducing agent, operatively coupled with the water scrubbing unit and arranged for introducing reducing agent to the water scrubber unit during operation thereof.

The semiconductor manufacturing process unit in such facility may be of any suitable type, as for example a plasma reaction chamber, chemical vapor deposition chamber, vaporizer, epitaxial growth chamber, or etching tool.

Another aspect of the invention relates to an effluent abatement scrubbing system comprising a water scrubber for scrubbing of an effluent gas, said system being constructed and arranged for performing at least one of the functions selected from the group consisting of:
(1) water scrubbing of effluent gas with addition or injection of chemical reducing reagents;
(2) water scrubbing of effluent gas containing silane, wherein clean dry air is introduced to the effluent gas or scrubbing liquid;
(3) utilizing a two-stage scrubbing system including an equilibrium scrubbing column and a polishing mass transfer column, to decrease required make-up water for scrubbing while simultaneously maintaining or increasing scrubbing efficiency relative to a single-stage scrubbing unit;
(4) adding clean dry air to effluent gas discharged from the equilibrium scrubbing column of (3), prior to its introduction to the polishing mass transfer scrubbing column, to abate silane when present with ammonia in the effluent gas stream;
(5) utilizing in a two-stage scrubbing system of (3) a foraminous containment structure containing bed packing as an insert in the polishing mass transfer column;
(6) contacting effluent gas in the scrubbing system with $OF_2$ reducing agents;
(7) controlling foaming in the scrubbing system by chemical antifoam agents and/or orifice restriction of flow of scrubbing liquid;
(8) preventing $CaCO_3$ buildup in the scrubbing system by one or more of the following:
 (a) magnetization of make-up water used for scrubbing;
 (b) control of the pH of the make-up water;
 (c) soda ash-lime softening of the make-up water; and
 (d) precipitation or flocculation treatment of the make-up water;
(9) suppressing clogging of a photohelic port including a photohelic sensing line in the scrubbing system, by passing a stream of purge gas through the photohelic sensing line, wherein the photohelic sensing line may optionally be heated; and
(10) heating an inlet structure used in the scrubbing system to introduce effluent gas to a scrubbing zone.

Still other aspects of the invention relate to inlet structures for a gas scrubbing system, removal means and methods for specific gas components to be abated from gas streams containing same, and specific scrubbing system features, techniques, subsystems and approaches.

Other aspects, features and embodiments of the invention therefore are more fully shown hereinafter, and will be more fully apparent from the ensuing disclosure and appended claims.

DETAILED DESCRIPTION OF THE INVENTION, AND PREFERRED EMBODIMENTS THEREOF

Figure 1:
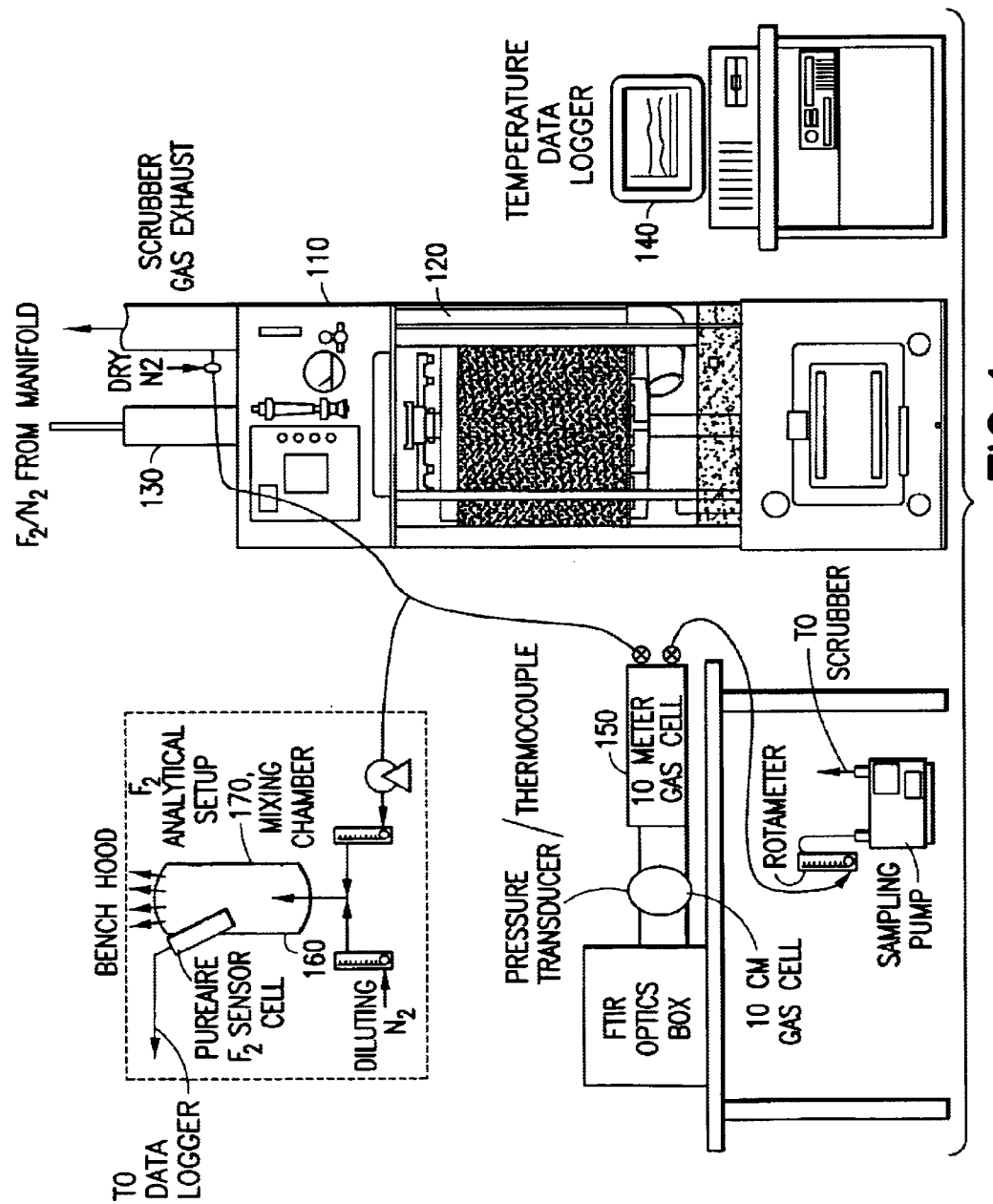
FIG. 1 is a schematic of a test setup used to characterize effluent gases and temperature profiles during abatement of $F_2$ and $SiF_4$.

The disclosures of the following U.S. patent applications are hereby incorporated herein by reference in their entireties:

U.S. patent application Ser. No. 09/086,033 filed May 28, 1998 in the name of Jose I. Arno for "Apparatus and Method for Point-of-Use Abatement of Fluorocompounds;"

U.S. patent application Ser. No. 08/857,448 filed May 16, 1997 in the names of Joseph D. Sweeney, et al. for "Clog-Resistant Entry Structure for Introducing a Particulate Solids-Containing and/or Solids-Forming Stream to a Fluid Processing System;"

U.S. patent application Ser. No. 08/778,386 filed Dec. 31, 1996 in the names of Scott Lane, et al. for "Clog-Resistant Entry Structure for Introducing a Particulate Solids-Containing Stream to a Fluid Processing System."

The present invention contemplates an effluent abatement system that may for example comprise one or more compatible aspects of the following features:

(1) water scrubbing of effluent gas, with or without chemical augmentation (e.g., by addition or injection of chemical reagents such as KOH or NaOH);

(2) scrubbing of effluent gas containing silane, wherein clean dry air is introduced to the effluent gas, e.g., in a single, double, or triple clean dry air injection, or by bubbling of clean dry air into liquid in a liquid-shrouded inlet structure, e.g., into liquid in a tip-over cup or a porous insert, or into scrubbing liquid, optionally with control of the flow rate of clean dry air by an arrangement involving generation of a control signal from a mass flow controller flowing the silane-containing effluent gas into the scrubbing system, or optionally, when ammonia is concurrently present, by heating of the effluent gas or a flow passage, e.g., inlet, through which same is flowed;

(3) utilizing a two-stage scrubbing system including an equilibrium scrubbing column and a "polishing" mass transfer column, to decrease required make-up water for scrubbing while simultaneously maintaining or increasing scrubbing efficiency relative to a single-stage scrubbing unit;

(4) adding clean dry air to the effluent gas discharged from the equilibrium scrubbing column of (3), prior to its introduction to the polishing mass transfer scrubbing column, to abate silane when present with ammonia in the effluent gas stream, optionally without any heating of the effluent gas;

(5) utilizing in a two-stage scrubbing system of (3) a liner containing bed packing as an insert structure in the polishing mass transfer column;

(6) contacting the effluent gas in the scrubbing system with $OF_2$ reducing agents;

(7) controlling foaming in the scrubbing system by chemical (antifoam agents) and/or physical (orifice structure) approaches;

(8) preventing $CaCO_3$ buildup in the scrubbing system by one or more of the following:
(a) magnetization of the make-up water used for scrubbing;
(b) control of the pH of the make-up water;
(c) soda ash-lime softening of the make-up water; and
(d) precipitation or flocculation treatment of the make-up water;

(9) prevention of photohelic clogging of a photohelic port in the scrubbing system by passing a purge stream of nitrogen or other purge gas through the photohelic sensing line, wherein the photohelic sensing line may optionally be heated; and

(10) heating an inlet structure used in the scrubbing system to introduce effluent gas to a scrubbing zone.

The invention is more fully described in the ensuing disclosure, wherein single features, as well as various combinations and permutations of different aspects of the invention may be employed, in various embodiments of the invention.

In one embodiment, the present invention utilizes chemical injection to enhance the abatement of fluorocompounds in water scrubbing treatment of fluorocompound-containing effluent gas streams. The invention is usefully employed in semiconductor manufacturing operations in which fluorocompound-containing effluent gas streams are produced and require treatment for discharge or compliance with applicable environmental effluent standards.

In contrast to the inability of standard water scrubbing techniques to remove high concentrations of fluorine and other fluorocompounds, the present invention achieves a substantial improvement in the art by enhancing the performance of the water scrubber system and reducing the formation of unwanted by-products in the operation of such system.

While the invention is primarily and illustratively described hereinafter in application to the abatement of fluorine gas in an effluent stream containing same, the process and apparatus of the invention may be employed to abate other fluorocompounds as well as other strong oxidizing gases (e.g., $ClF_3$, $Cl_2$, etc.) and liquids.

In addition, while the invention is illustratively described hereinafter as a stand-alone scrubbing unit, the scrubber apparatus and process of the invention may be used in combination with other processes and apparatus, such as for example, as pre-thermal abatement and post-thermal abatement water scrubber columns utilized in conjunction with a thermal processing unit.

In the present invention, a reducing agent is utilized to increase the abatement efficiency of fluorine or other fluorocompound, and to inhibit the formation of OF2. The reducing agent can be injected as a solid or as a solution, utilizing reducing agents that are stable to air-oxidation. The reducing agent may comprise any suitable reducing agent that is effective to enhance the removal of fluorocompound in an aqueous scrubbing environment. Examples of preferred reducing agents include sodium thiosulfate, ammonium hydroxide, and potassium iodide. The most preferred reducing agent is sodium thiosulfate, a non-toxic, non-alkali, readily available, and inexpensive compound.

The apparatus of the invention for abatement of fluorocompound in the effluent stream being treated may include means for monitoring fluorocompound concentration or presence in the fluorocompound-containing effluent gas stream, and responsively adjusting the introduction of reducing agent to the water scrubber unit.

Such means may for example include a pH monitoring device for monitoring the pH of the effluent stream to be treated and responsively introducing the reducing agent at a rate and in an amount correlative to the sensed pH value.

Alternatively, such means may include an exhaust gas monitor for determining the amount of the fluorocompound in the effluent stream and responsively introducing the reducing agent to the effluent stream in an amount and at a rate determined by the sensed concentration of the fluorocompound.

In general, the means for monitoring fluorocompound concentration in the fluorocompound-containing effluent gas stream, and responsively modulating the introduction of reducing agent to the water scrubber unit, may be widely varied, and utilized to minimize the amount of added reducing agent in the abatement of the fluorocompound in the effluent stream.

The present invention achieves efficient abatement of fluorocompounds such as fluorine using reducing agents that enhance fluorine abatement (relative to water scrubbing in the absence of such chemical agent) while maintaining acceptable levels of $OF_2$.

FIG. 1 schematically illustrates an apparatus used to characterize effluent gases and temperature profiles during the abatement of $F_2$ and $SiF_4$. An automated gas delivery manifold equipped with mass flow controllers is used to generate the nitrogen and $F_2$ or SiF4 mixtures introduced into the scrubber. A water scrubber unit 110 is provided for effluent stream treatment. At the exhaust of the water scrubber unit 110 is a packed bed counter-current flow polishing unit 120.

In order to minimize corrosion at the inlet of the scrubber, the metal portion 130 of the inlet may be coated with nickel or other corrosion-resistant material. Additionally, or alternatively, air or other oxygen-containing gas may be introduced to the inlet to assist in the abatement of undesired components of the gas stream. Such air or other gas addition at the inlet may be carried out in a bubbling or non-bubbling fashion, as necessary or desirable in a given application of the present invention.

The gas being treated in the water scrubber unit could be derived from any suitable upstream process, e.g., a plasma enhanced chemical vapor deposition (PECVD) process. In this process, ammonia ($NH_3$) and silane ($SiH_4$) are flowed into the reactor chamber during the deposition stage in order to form a silicon nitride layer (typically $Si_3N_4$) on a wafer surface.

During the clean stage, nitrogen trifluoride ($NF_3$) is flowed into the chamber in order to etch deposits off the chamber walls. The $NF_3$ is may be broken down to fluorine ($F_2$) and nitrogen ($N_2$) by a plasma in the reactor chamber or in a chamber just prior to the reactor chamber. The $F_2$ then etches deposits from the reactor chamber walls, thereby "cleaning" the chamber.

The by-products of the clean process are $F_2$, silicon tetrafluoride ($SiF_4$), hydrogen fluoride (HF), unreacted $NF_3$, and potentially smaller amounts of other compounds such as carbonyl fluoride ($COF_2$), etc. Therefore, during the deposition step, the water scrubber system is exposed to $SiH_4$ and $NH_3$, while during the clean step, the water scrubber system is exposed to $F_2$, $SiF_4$, HF, $NF_3$, $COF_2$, and other species.

Other upstream processes generating gaseous effluents susceptible to treatment by the apparatus and method of the present invention include, without limitation, metal etch, oxide etch, poly etch, nitride etch, low pressure chemical vapor deposition (LPCVD), epitaxial silicon (EPI), tungsten chemical vapor deposition (WCVD), tungsten etch, polysilicon, atmospheric pressure chemical vapor deposition (APCVD), and dielectric chemical vapor deposition (DCVD), among others.

Gas and water temperatures within the scrubber are measured at selected points in order to monitor the process during the abatement process. The abatement system may be monitored by any suitable means, e.g., a process monitoring and control system including computer 140.

Infrared active gas phase species present at the scrubber exhaust are drawn into an FTIR spectrophotometer, e.g., a MIDAC I-2000 FTIR spectrophotometer, commercially available from MIDAC Corporation, for quantitative analysis. The unit is equipped with a nickel-coated gas cell 150 having a ten-meter pathlength, with ZnSe windows, and a liquid nitrogen-cooled MCT detector. The spectrometer is set at appropriate monitoring settings, e.g., to average 16 scans covering the spectral region between 600 and 4200 cm−1 at a resolution of 0.5 cm−1. Full spectra are periodically collected, e.g., every 30 seconds, to provide continuous, real-time information on the nature and concentration of the species of interest. Accurate quantitative analyses are suitably achieved by calibrating the analyzer in situ using known $SiF_4$ and HF concentrations. Oxygen difluoride ($OF_2$) absorbencies are converted into concentrations using a quantitative spectral library issued by MIDAC Corporation.

Fluorine gas is analyzed in a continuous mode using a gas sensor cell 160 such as an F2 specific Pure Air gas sensor cell (Pure Air Monitoring Systems, Inc.). This electrochemical (pH) sensor utilizes gas membrane galvanic cell technology to monitor low concentrations of toxic gas. The sensor is specially designed for in situ monitoring of $F_2$ under water vapor-saturated conditions. In order to provide continuous analyses within the detection limit of the monitoring device (3 ppm $F_2$), known flow rates of scrubber gas exhaust are diluted with metered nitrogen flows. The combined stream is introduced into a mixing chamber 170 equipped with the $F_2$ sensor. The monitor responds to changing $F_2$ concentrations. The concentration data are logged into the computer at 30 second intervals. Accurate quantitative results are achieved by calibrating the sensor against known concentrations of $F_2$.

As an alternative to using a pH meter to control the chemical injection rate, a reduction/oxidation (REDOX) potential electrode may be employed for such purpose. Unlike a pH meter (which is suitably arranged to start the reducing agent addition based on the acid concentration present), a REDOX electrode may be arranged to initiate the injection of the reducing agent when the ionic potential of the water solution in the sump reaches a given level. The improvement afforded by the REDOX potential electrode arrangement over the pH control system relates to the fact that injection of a reducing agent based on the ionic potential of a solution is a more direct means to equilibrate chemical reactions in solution than pH-mediated injection.

Figure 2:
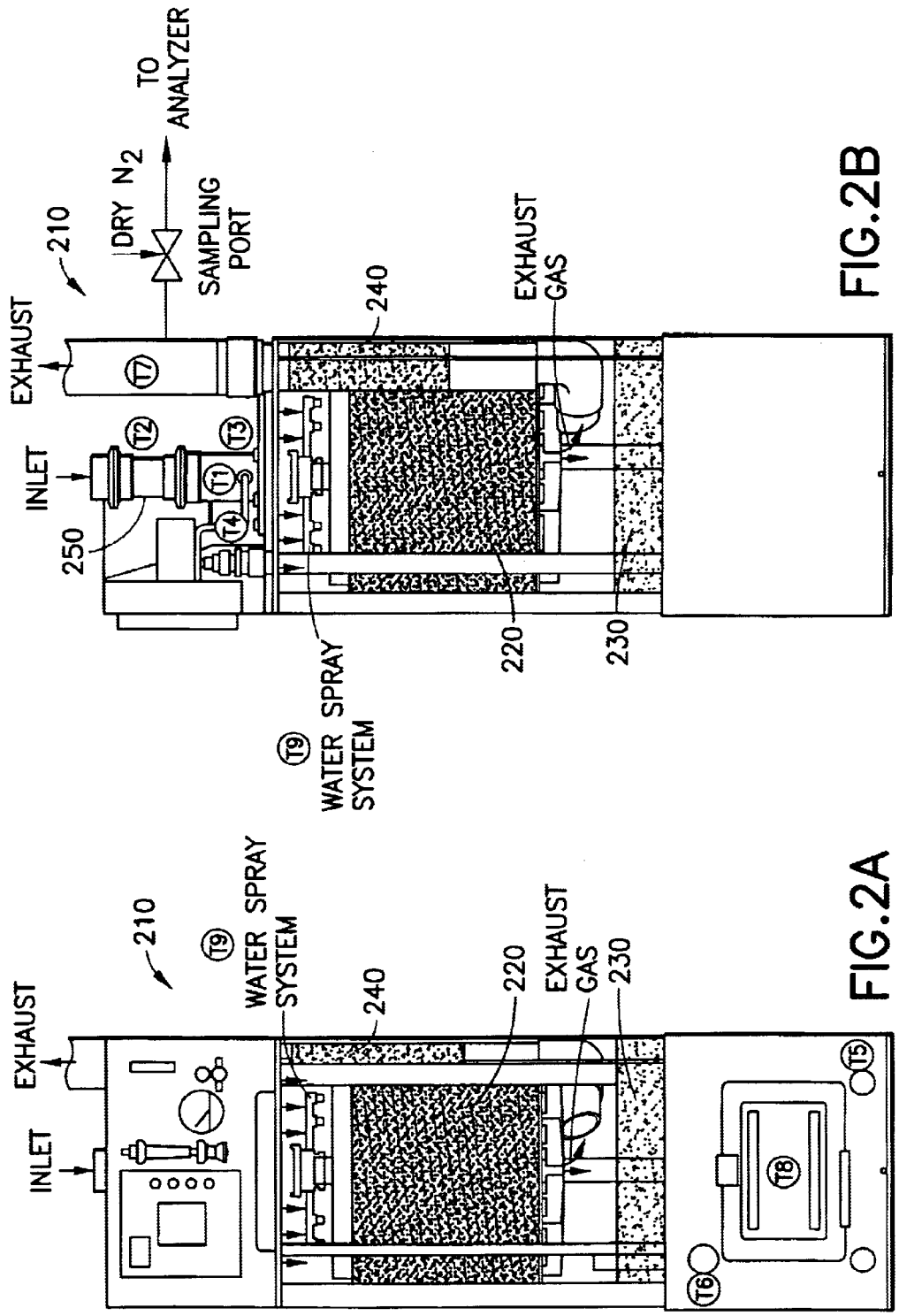
FIG. 2 is a sectional perspective view of a water scrubber system according to one embodiment of the invention.

FIG. 2 is a further detailed illustration of a water scrubber 210, which is of a type similar to the water scrubber unit 110 shown in the FIG. 1 system. The water scrubber operates using a vertical co-current flow of water and the contaminated gas stream. Water active species are hydrolyzed as they interact with water in a high surface area packed region 220. The resulting liquid falls to a water reservoir or sump 230, and the resulting scrubber gas stream exits the scrubber through a vertical duct connected to a blower. The water dynamics of the water scrubber include fresh or make-up water flowing into the system, water draining out, and continuous recirculation of water stored in the sump 230. The performance of the scrubber is enhanced using a counter-current packed polishing bed 240 installed at the gas exhaust. The inlet 250 is nickel-coated to minimize solid deposits and protect the entry from corrosive attack. Gas and water temperatures within the scrubber are measured at nine selected points as identified in FIG. 2.

As an alternative to using chemical injection to enhance the abatement of fluorine gas and to inhibit the formation of OF2 as a by-product, means may be provided for supplying electrons to the water solution in order to drive the reactions $$F_2 + e^- = 2F^-$$

and $$OF_2 + 2H^+ + 4e^- = 2F^- + H_2O$$

to completion.

Although any suitable means may be employed for supplying the electrons, a preferred arrangement utilizes electrodes inserted into the scrubber sump and connected to an external direct current (DC) power source. In addition to obviating the need for added chemicals, electron generation requires only the use a small amount of DC power.

As another arrangement of related type, which obviates the need for chemical injection to enhance the abatement of fluorine gas and inhibit formation of OF2 as a by-product, electrons in solution may be supplied by the use of a sacrificial anode, e.g., made of a metallic mesh or plate, and immersed in the sump of the scrubber. The metal (M) will decompose via the following reaction:

$$M = M^{2+} + 2e^-$$

In operation, the acidity of the scrubber sump water solution will prevent the unwanted formation of a passivation layer on the surface of the metal. Unlike the electrolytic cell embodiment described hereinabove, the use of a sacrificial anode does not require an external power source. Instead, the operation of the sacrificial anode arrangement is based on the voltaic or galvanic cell principle, according to which the spontaneous oxidation reaction of the sacrificial metal generates the necessary electrons.

Another embodiment of the invention relates to the removal of oxygen difluoride in the water scrubber without the addition of a chemical reducing agent. In one aspect, this may be effected by irradiation of the effluent medium with a suitable radiation to effect photolysis of the oxygen difluoride, e.g., using ultraviolet light at 365 nm wavelength (gas phase photolysis of OF2 occurs at this wavelength with a quantum yield of 1 at room temperature; see Gmelin Handbook, F Suppl. Vol. 4, page 45). Such radiation exposure may be implemented at the exhaust of the scrubber or in the main packed bed of the scrubber unit.

As another alternative for removal of oxygen difluoride in the water scrubber without the addition of a chemical reducing agent, the scrubber exhaust stream may be heated to suitable temperature, e.g., of 250–270° C. $OF_2$ decomposes via a homogeneous mononuclear reaction at these temperatures (see Gmelin Handbook, F Suppl. Vol. 4, page 43).

As still another alternative for removing oxygen difluoride in the water scrubber, a reactant species is introduced to the scrubbing liquid to reactively abate the $OF_2$. Potential useful chemical reactants for such purpose, without limitation, $AlCl_3$, $NH_3$, $As_2O_3$, $Br_2$, CO, $Cl_2$, ($Cl_2$+Cu), $CrO_3$, $H_2$, $H_2S$, I, Ir, $CH_4$, $O_3$, ($O_2$+$H_2O$), Pd, $P_2O_5$, Pt, Rh, Ru, $SiO_2$.

In another embodiment, a platinum or palladium catalyst may be utilized downstream of the water scrubber to abate oxygen difluoride, in the presence of hydrogen added from an external source, or generated in situ by silane decomposition reaction to generate hydrogen, or with bubbling of hydrogen into the scrubbing liquid, to provide the reactant hydrogen concentration.

The features and advantages of the present invention are more fully shown with respect to the following illustrative examples.

EXAMPLE 1

In a system of the general type shown in FIGS. 1 and 2, abatement of $SiF_4$ was carried out using an effluent stream simulating effluent produced in a semiconductor manufacturing facility by cleaning of plasma reaction chambers.

Table 1 below summarizes results for the abatement (destruction and removal efficiency, % DRE) of $SiF_4$, with and without the injection of caustic. The abatement in this instance did not include the introduction of a reducing agent.

Fixed concentrations (300 ppm) of silicon tetrafluoride balanced with 120 slpm of nitrogen were introduced into the water scrubber. The experimental conditions were chosen to represent or exceed effluent gas concentrations released during typical plasma chamber cleans. Abatement efficiencies were measured as a function of water flow rates (0.5 and 1 gpm), and scrubber pH (with and without caustic injection). In all cases investigated, measured scrubber outlet concentrations of HF and $SiF_4$ were slightly above the detection limits of the spectrometer and significantly below their respective threshold level values (TLV) ($SiF_4$ TLV=1 ppm, HF TLV=3 ppm).

TABLE 1

Summary of Abatement Results at Fixed Inlet Challenge of 300 ppm $SiF_4$ in 120 slpm $N_2$.

| Water Flow rate (gpm) | Caustic Injection? (pH) | HF conc. (ppm) | SIF4 conc. (ppm) | % DRE |
|---|---|---|---|---|
| 1 | No (3.85) | 0.47 | 0.3 | 99.86 |
| 0.5 | No (3.50) | 0.46 | 0.3 | 99.86 |
| 1 | Yes (10.5) | 0.15 | 0.1 | 99.95 |
| 0.5 | Yes (10.8) | 0.13 | 0.075 | 99.96 |

EXAMPLE 2

Fluorine gas flow rates ranging between 0.5 to 5 slpm were delivered into a Vector®—100 water scrubber (ATMI Ecosys Corporation, San Jose, Calif.) that was equipped with a passivated manifold. These streams were diluted with 50 slpm of balanced nitrogen resulting in challenges between 1 and 6% $F_2$. In addition, the effects of residence time within the scrubber were studied by increasing the nitrogen flow rate to 200 slpm. The performance of the scrubber unit was tested using standard (1.2 gpm) and low (0.75 gpm) water flow rates. Sodium thiosulfate was used during high fluorine gas challenges to improve fluorine gas removal and to eliminate the formation of $OF_2$ as a by-product.

Table 2 summarizes the experimental data, and illustrates the enhancement achieved by injection of sodium thiosulfate as a reducing agent.

Figure 4:
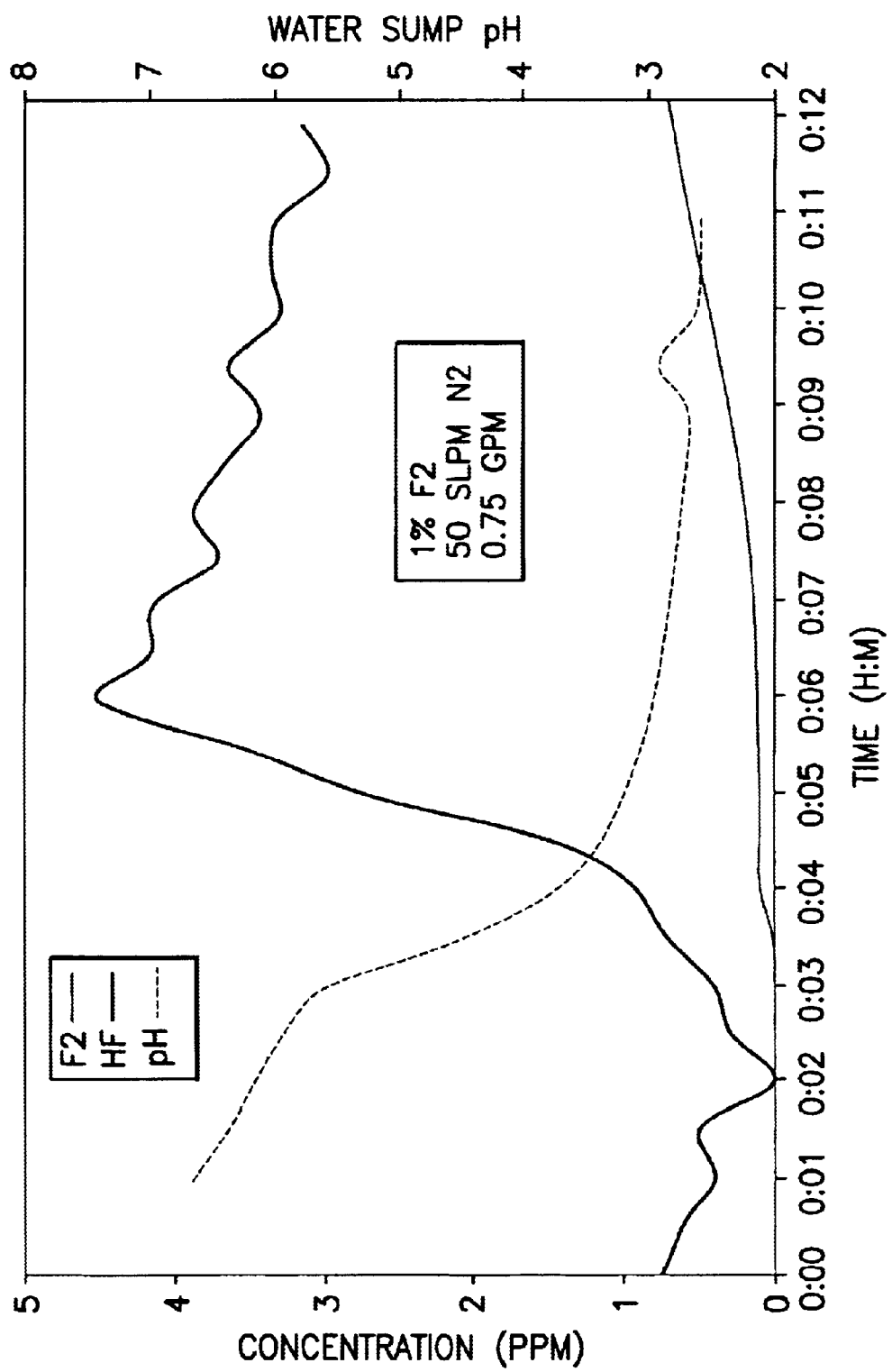
FIG. 4 is a graph of concentration in ppm as a function of time for selective compounds measured at the outlet of a scrubber unit operated in accordance with the present invention.

FIG. 4 shows the scrubber sump pH and exhaust concentration of HF and $F_2$ as a function of time. The graph demonstrates that breakthrough of gases is significantly

TABLE 2

Summary of Fluorine Abatement Results

| Test # | Water Flow (gpm) | N2 Balance (slpm) | F2 Flow Rate (slpm) | F2 inlet (ppm) | Chem. Enhance? | HF Out. Conc. (ppm) | F2 Out. Conc. (ppm) | OF2 Out. Conc. (ppm) | Outlet F2 Equiv. (ppm) | % DRE |
|---|---|---|---|---|---|---|---|---|---|---|
| 1 | 1.2 | 50 | 1 | 20000 | No | 7.5 | 1.5 | 1.25 | 6.5 | 99.97 |
| 2 | 1.2 | 50 | 2 | 40000 | No | 12 | 2.5 | 3 | 11.5 | 99.97 |
| 3 | 1.2 | 50 | 3 | 60000 | No | 15 | 20 | 4 | 31.5 | 99.95 |
| 4 | 0.75 | 50 | 0.5 | 10000 | No | 4 | 0.5 | <1 | 3.5 | 99.97 |
| 5 | 0.75 | 50 | 1 | 20000 | No | 6 | 1 | 1 | 5 | 99.98 |
| 6 | 0.75 | 50 | 2.25 | 45000 | No | 20 | 5 | 5 | 20 | 99.96 |
| 7 | 0.75 | 50 | 3 | 60000 | No | 28 | 50 | 10 | 74 | 99.88 |
| 8 | 0.75 | 50 | 2.25 | 45000 | Yes | 2.25 | 0.5 | <1 | 1.6 | 99.996 |
| 9 | 0.75 | 200 | 3 | 15000 | Yes | 25 | 38 | <1 | 50.5 | 99.7 |
| 10 | 0.75 | 200 | 5 | 25000 | Yes | 42 | 120 | <1 | 141 | 99.4 |

Percent destruction and removal efficiencies (%DREs) were determined using the standard expression $$\%DRE = 100 \times \left(1 - \frac{Outlet\ F_2\ Equiv.}{Inlet\ F_2}\right)$$

wherein Inlet $F_2$ represents fluorine inlet concentration in ppm, and Outlet $F_2$ Equiv. is defined as:

Outlet $F_2$ Equiv.=[Outlet $F_2$ conc.]$_{ppm}$+½[Outlet HF conc.]$_{ppm}$+ [Outlet $OF_2$ conc.]$_{ppm}$ In the above formula, percent DRE is determined using inlet and outlet concentrations, adjusted for dilution effects, since concentration is dilution-influenced. Such determination provides a measure of actual mass of fluorine out v. actual mass of fluorine into the scrubber system.

Under all conditions investigated, the water scrubber removes over 99% of the fluorine delivered. It should be noted that the removal efficiencies set out in Table 2 represent performance of the reducing agent-enhanced water scrubber treatment of the invention under worst-case scenarios with respect to the effluent gases released during a conventional plasma chamber clean.

Most importantly, the tabulated outlet concentrations represent the equilibrium values reached after extended and continuous delivery of fluorine gas into the scrubber. This steady state typically is achieved between 10 and 30 minutes after the start of tests depending on the initial $F_2$ concentration. The duration of chamber cleans are often a fraction of the time necessary to reach that equilibrium.

Figure 3:
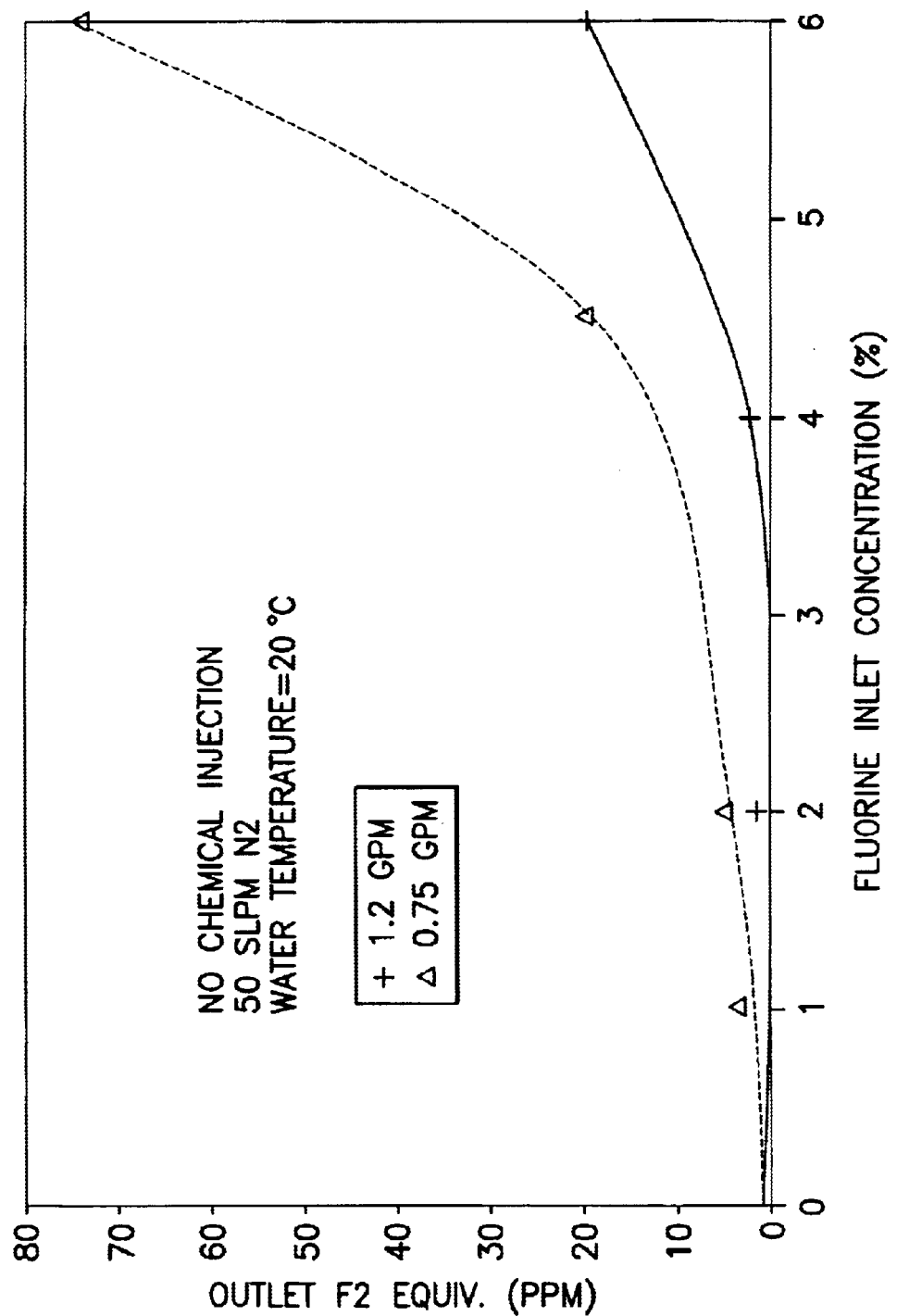
FIG. 3 is a graph of outlet fluorine equivalent, in parts per million, as a function of fluorine inlet concentration.

FIG. 3 illustrates the effect of water use on fluorine abatement efficiency. As expected, make-up water flow rate affects scrubbing efficiency and is a limiting factor under high fluorine challenges. Without chemical enhancement, OF2 concentrations at the outlet of the scrubber exceed 3 ppm when delivering approximately more than 3% and 6% $F_2$ (50 slpm $N_2$ ballast) using 0.75 and 1.2 gpm water respectively. Tests 8 to 10 (see Table 2) demonstrate that chemical injection inhibits OF2 formation in addition to enhancing scrubbing efficiency. For example, the experimental conditions of tests 6 and 8 are identical with the exception of delivery of the chemical enhancer. Chemical injection decreases the outlet concentrations of HF and $F_2$ by a factor of 10 and decreases $OF_2$ concentration to below detection limits.

delayed and a function of water pH. Second, the time-dependent concentration of $F_2$ released during typical chamber cleans is not constant. During the initial stages, most $F_2$ produced in the chamber is used to react with $SiO_2$ releasing $SiF_4$ gas. It is only after $SiO_2$ is depleted, that excess $F_2$ is discharged by the tool in significant amounts.

Analyses of the temperature data collected during this study indicate that heat generated by exothermic reactions is effectively dissipated within the scrubber. The only measurable temperature changes were recorded inside the scrubber inlet entry at the first interface between incoming gas and water vapor. A maximum temperature increase from 17° C. to 26° C. (ΔT=9° C.) was detected during the highest fluorine challenges. The heat capacity of the large volume of recirculating water combined with heat exchange with the surroundings effectively quenched the heat generated by the hydrolysis of F2. In addition, no significant signs of corrosion or material deterioration were found anywhere within the scrubber (including the entry system) after completion of the tests. Overall, the scrubber was exposed to and efficiently abated 3.2 lbs. (or the equivalent of 855 liters) of fluorine gas.

The foregoing data illustrate the advantages of the present invention in providing enhanced removal of fluorine gas from a fluorine-containing effluent stream.

In another aspect, the present invention relates to an effluent gas treatment system for abating silanes, $SiR_4$ wherein R may for example be hydrogen, halogen (F, Cl, Br, I) alkyl (e.g., $C_1$–$C_8$) alkyl, alkoxy, alkene, alkyne, or any other suitable substituents. While the ensuing discussion is directed to silane per se ($SiH_4$), it will be understood that other silane derivatives may be likewise abated, such as for example tetramethylvinyl silane (TMVS).

It has been surprisingly and unexpectedly found that silane can be destroyed with an efficiency up to about 50% in a high efficiency water scrubbing unit when using neutral water as the scrubbing liquor. This is a very surprising result, since it is well known that silane is highly insoluble in water and that silane is non-reactive in non-basic aqueous solutions. It may be that the removal reaction of silane in water is catalyzed by the small amount of O2 that is naturally present in water.

Although the silane removal efficiencies obtained are in some instances less than 100%, the fact that silane can be reacted even modestly in the water scrubber is a profound discovery. As a practical matter, industrial facilities generating silane-containing effluents do not always require high destruction efficiencies of silane; sometimes simply reducing the silane concentration to below lower explosive limit (LEL) levels is acceptable. It is possible to obtain improved efficiencies simply by adding additional water scrubbing stages to the water scrubber, or by bubbling additional air into the make-up water.

A second way in which silane can be abated in a water scrubber is by use of a caustic chemical injection agent such as KOH. The water scrubber as previously described herein may be equipped with an integral chemical injection system that will meter the chemical injection agent into the water scrubber either at a preset rate, or at a rate determined by a setpoint of the scrubbing liquor pH.

The advantage of the foregoing approaches is that a thermal oxidizing scrubber or thermal oxidizing module is not required for silane abatement, so that the cost of ownership of the effluent treatment system is thereby significantly reduced in relation to systems using thermal oxidizer processing units. Another advantage is that corrosion is obviated because the acid gases that are present are not heated. A further advantage is that the reaction by-product, silica, is formed in the scrubber and therefore is washed away with the waste water. This contrasts to the clogging due to silica or silicon nitride that often occurs in thermal oxidizer units.

Figure 5:
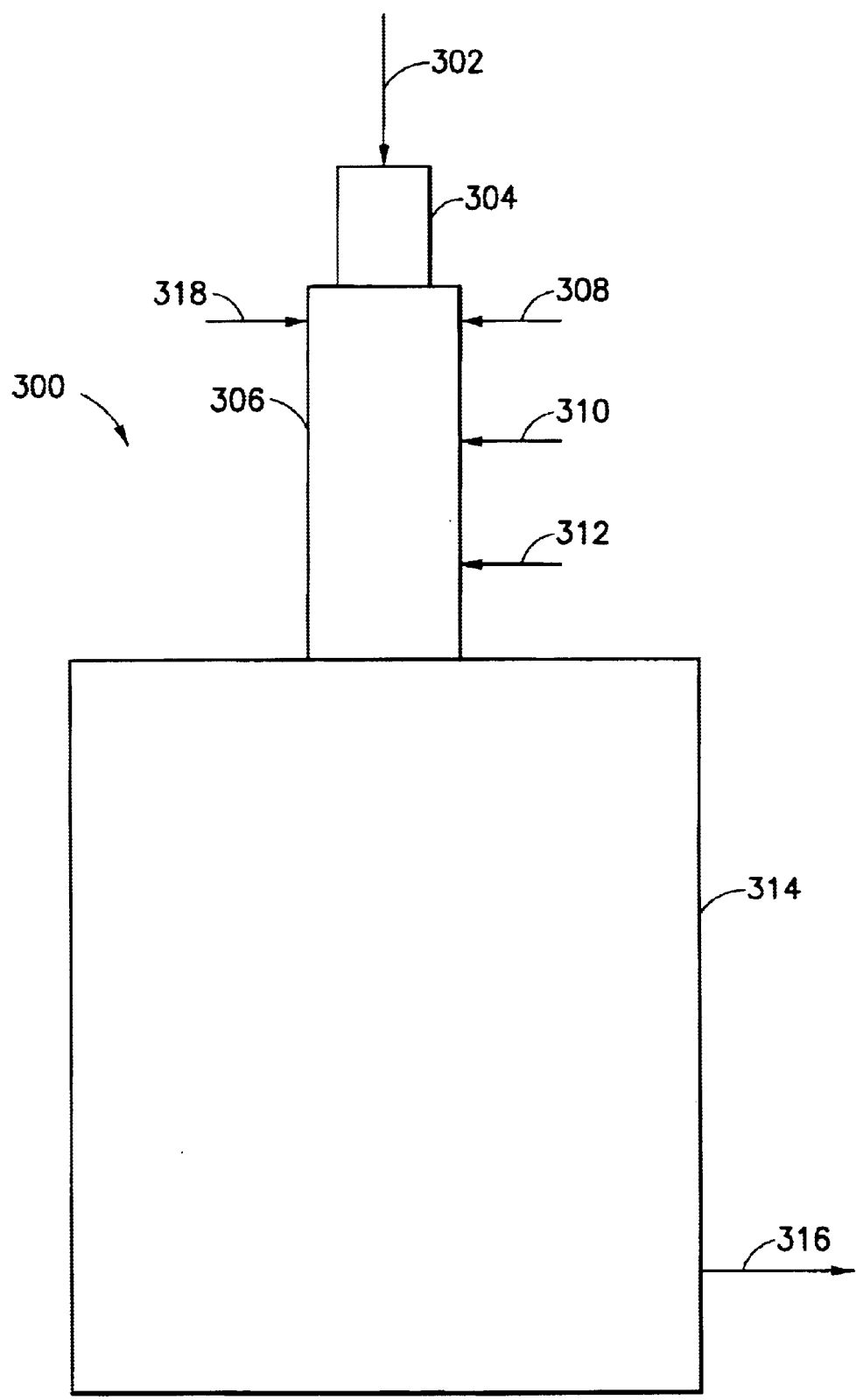
FIG. 5 is a schematic elevation view of an inlet structure that may be employed to abate silane upstream of a scrubber unit to which the inlet structure is joined in fluid flow communication.

In another embodiment, silane may be abated by use of an entry module 300 as shown in FIG. 5 that is specifically designed to abate silane upstream of the scrubber unit 314 in an abatement system comprising such scrubber unit. Gas containing silane from an upstream process unit (not shown) is introduced in feed line 302 to the inlet port 304 of the entry module 300, and then flowed into the entry tube 306, which is fed with water in line 318 from a suitable source of same (not shown in FIG. 5). In the entry tube, the gas from line 302 is mixed with the water from line 318, and clean dry air (CDA) is injected to assist in oxidizing the silane component. The CDA may be serially injected as shown in FIG. 5, where injection lines 308, 310 and 312 are shown that discharge the CDA into the gas/water mixture at intervals along the entry tube.

The resulting gas/air/water stream then enters the scrubber unit 314, and the gas stream is scrubbed by water to produce a stream of silane-reduced gas that is discharged from the scrubber 314 in discharge line 316.

The entry module 300 may be formed of a suitable non-corrosive material such as stainless steel and functions as a non-thermal oxidizer, with the clean dry air being introduced into the entry tube. This design is advantageous as compared to conventional thermal oxidizers, in that thermal energy is required, NOx is not formed, and corrosion is avoided since temperatures are low (e.g., ambient or near-ambient).

In operation, the effluent passed into the stainless steel entry tube 306 and CDA is introduced at specific locations. The CDA reacts with the silane to form silica ($SiO_2$), silicic acid ($H_2SiO_3$), or some hydrated silicate ($SiO_2*xH_2O$). No spark nor heat is required, even if the incoming concentration of silane is below its LEL. Silane abatement efficiencies as high as 95+% may be achieved. The CDA flow rate required for silane destruction will vary depending upon the particular character of the incoming effluent gas (e.g., silane concentration and $N_2$ flow rate).

CDA may be introduced to the entry at one or more than one location, or in sequential stages. It can also be bubbled into the scrubber liquid. In this way, the silane destruction efficiency may be selectively enhanced as required in a given treatment application. When multiple CDA stages are employed, the distance between CDA stages may be readily experimentally optimized without undue effort, and is a function of overall gas flow rate and silane flow rate.

A further modification of such entry structure may involve linking a silane-containing gas stream mass flow controller (MFC) with a valve controlling CDA to the entry structure. Such system may be arranged so that in the event of an MFC failure, the CDA valve will open up, allowing a selected flow rate of CDA to enter the specified CDA stage. Such extra CDA ensures that the additional silane flowing to the scrubber will be abated. This control system can also be implemented using $N_2$ instead of CDA, so that the $N_2$ would simply be used as a dilution agent in order to ensure that the silane concentration would be brought to below its LEL level.

As a safety feature, it may be desirable to controllably ignite the silane with a large amount of CDA, or it may be desirable to simply dilute the silane with an inert gas such as $N_2$. It would not be desirable to continuously run high flow rates of CDA or $N_2$ when the MFC is operating properly, since this would be a waste of CDA or $N_2$.

In addition to CDA, water is also a necessary component for operation of the entry structure. The water may be plumbed to the entry structure such that a jacketed chamber is formed around the entry tube through which the effluent gas passes. In an illustrative embodiment, the water is forced to the top of the entry structure and flows over a weir so that a wetted wall column is formed for the entirety of the tube through which the effluent gas passes. The wetted wall column keeps the entry structure cool and also serves to remove any solid by-products of the silane/$O_2$ reaction. Such structure may include a wetted wall column of the type shown in U.S. patent application Ser. No. 08/857,448 filed May 16, 1997 in the names of Joseph D. Sweeney, et al. for "Clog-Resistant Entry Structure for Introducing a Particulate Solids-Containing and/or Solids-Forming Gas Stream to a Gas Processing System" and U.S. patent application Ser. No. 08/778,386 filed Dec. 31, 1996 in the names of Scott Lane, et al. for "Clog-Resistant Entry Structure for Introducing a Particulate Solids-Containing Stream to a Fluid Processing System," the disclosures of which hereby are incorporated herein by reference in their entireties.

Another possible modification of the entry structure involves bubbling CDA into the water that forms the wetted wall column within the entry tube passage.

It will be understood that the optimal amount of added CDA will depend on the specific flow conditions of $SiH_4$, $N_2$, and other gases such as NH3 that are processed in the facility. The optimal CDA flow rate may for example be in the range from about 0.1 standard cubic feet per hour (scfh) to about 100 scfh.

Figure 6:
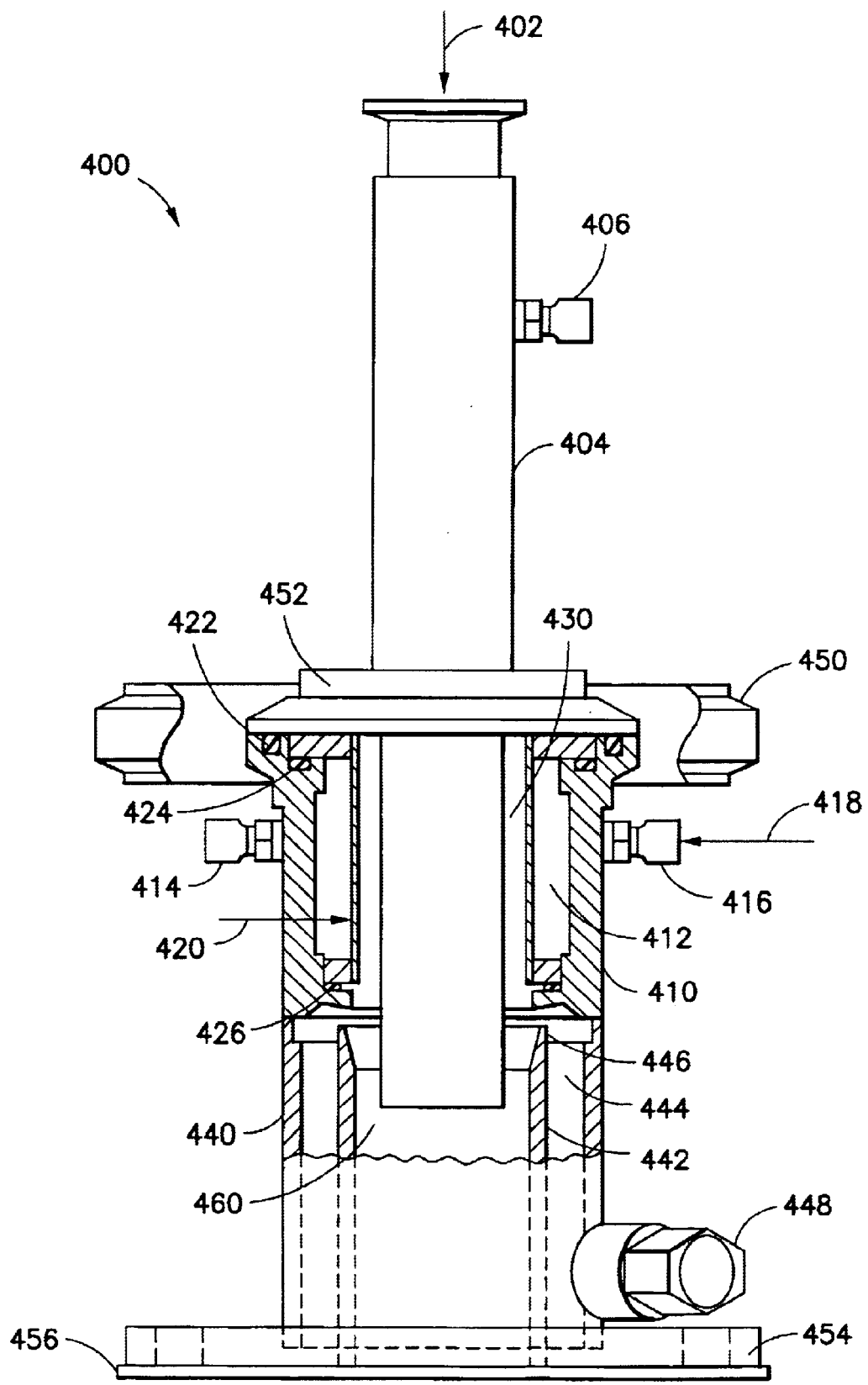
FIG. 6 is a partial sectional elevation view of another inlet structure that may be employed to abate silane in an effluent gas stream containing same.

FIG. 6 is a schematic representation of another type of inlet structure 400 that may be used to abate silane in an effluent gas stream containing same.

The inlet structure 400 receives silane-containing effluent gas from an upstream source (not shown) such as a semiconductor manufacturing facility. The gas is introduced in line 402 and flows into the entry tube 404 equipped at an upper portion thereof with a photohelic port 406. The photohelic port may be heated by flow of nitrogen or other suitable gas at elevated temperature, or alternatively at ambient temperature, therethrough (e.g., in an interior passage of the port, or in a jacket circumscribing the port), to prevent the port from clogging.

Such arrangement overcomes the tendency of the photohelic port to clog whenever the effluent gas contains a condensable component.

The entry tube 404 extends downwardly into a lower tubular passage member 410 of greater cross-section than the entry tube, and discharges the gas into the interior passage 460 of the lower tubular passage member 410.

The lower tubular passage member 410 comprises a cylindrical outer wall having an upper section equipped with gas inlet ports 414 and 416. Nitrogen or other suitable gas, pressurized to an appropriate level, is flowed in line 418 through the ports into the interior circumscribing passage 412. Passage 412 is bounded by a porous inner wall 420 that is in radially spaced-apart relationship to the outer wall. The porous inner wall may be formed of a sintered metal, porous mesh or other suitably gas-permeable material that allows flow of the pressurized gas through the permeable wall into the interior passage 430 communicating with the interior passage 460.

In this manner, the upper section is shrouded with the pressurized gas so that the interior wall surfaces thereof are protected from contact with the gas, so that condensation and deposition of solids on the wall surfaces is minimized. The upper section of the tubular passage member 410 is capped by an annular flange 452 that is sealed in position in the structure by means of the O-rings 422 and 424. The annular flange 452 is retained in place by a locking ring 450 that may be selectively manually disengageable to allow interior access to and disassembly of the structure.

The lower section of the tubular passage member 410 features outer wall 440 in radially spaced-apart relationship to the inner wall 442 forming an annular volume 444 therebetween. Communicating with the annular volume is a water inlet 448, which is joined to a suitable source of water. The introduced water thereby enters the annular volume 444 and overflows at the upper end 446 of the inner wall 442, thereafter flowing down the inner surface of the wall 442, to protect the surface of the wall from contact with the gas stream being treated, while concurrently flushing the wall surface to remove any particulates that may contact the falling water film thereon.

The lower section of the tubular passage member 410 terminates in a radially extending flange 454, that has a gasket 456 positioned thereon at its lower face, for leak-tightly securing the inlet structure to a downstream unit, such as a water scrubber unit, an oxidation unit, chemical dosing chamber, or other component of the effluent gas treatment system.

The inlet structure of FIG. 6 when used for introduction of a silane-containing gas stream to a scrubber unit is effective for destruction of silane at concentrations below the lower explosive limit. When clean dry air is bubbled into the water at the inlet, silane removal efficiencies of 98%+ may be achieved at modest flow rates of CDA, e.g., flows on the order of 4–5 standard cubic feet per hour. Alternatively, CDA may be flowed through one or both of the nitrogen ports shown in FIG. 6.

As a specific example of the silane removal efficacy of an inlet structure of the type shown in FIG. 6 in application to the scrubbing treatment of a gas stream containing silane, and introducing clean dry air to the gas stream, Table A below sets out the results of a test of such a scrubbing system, both with and without caustic (NaOH) addition (such chemical addition being effected by chemical injection in the scrubber unit, as described elsewhere herein).

The tabulated data in Table A include the inlet concentration of the silane component in parts per million by volume (ppm), the outlet concentration, at a silane flow rate of 480 standard cubic centimeters per minute (sccm), at scrubbing rates (scrubbing liquid flows) of 1 gallon per minute (gpm) and 0.5 gpm, together with the flow rate of clean dry air, in standard cubic feet per hour, scfh) and the percent dry removal efficiency (efficiency on a dry basis), %DRE, of the silane.

TABLE A

SiH4 Destruction, at Silane Flow Rate of 480 sccm

| CDA (scfh) | inlet conc. | Outlet SiH4 (ppm) 1 gpm | 0.5 gpm | % DRE (1 gpm) | % DRE (0.5 gpm) |
|---|---|---|---|---|---|
| No Caustic | | | | | |
| 0 | 6920 | 3446.3 | 3578 | 50.2 | 48.3 |
| 2 | 6827 | 1571 | 1900 | 77.0 | 72.2 |
| 4 | 6737 | 130.4 | 290 | 98.1 | 95.7 |
| 6 | 6649 | 1663.8 | 1695 | 75.0 | 74.5 |
| With Caustic | | | | | |
| 0 | 6920.4 | 762 | 1755 | 89.0 | 74.6 |
| 2 | 6827.5 | 1206 | 1616 | 81.3 | 76.3 |
| 4 | 6737.0 | 819 | 920 | 87.8 | 86.3 |
| 6 | 6648.9 | 765 | 930 | 88.5 | 86.0 |
| 8 | 6563.1 | 880 | | 86.6 | |

The foregoing shows the introduction of CDA to the gas stream upstream of the scrubber is highly effective in abating silane in the gas stream.

Other inlet structures may be usefully employed in the broad practice of the invention, including the inlet structures disclosed in U.S. patent application Ser. No. 08/857,448 filed May 16, 1997 now U.S. Pat. No. 5,935,283, in the names of Joseph D. Sweeney, et al. for "Clog-Resistant Entry Structure for Introducing a Particulate Solids-Containing and/or Solids-Forming Stream to a Fluid Processing System" and U.S. patent application Ser. No. 08/778,386 filed Dec. 31, 1996 now U.S. Pat. No. 5,846,275, in the names of Scott Lane, et al. for "Clog-Resistant Entry Structure for Introducing a Particulate Solids-Containing Stream to a Fluid Processing System," the disclosures of which are hereby incorporated herein by reference in their entireties.

As another approach for abating silane in gas streams containing same, potassium hydroxide or other suitable reactant can be contacted with the gas stream prior to or in conjunction with the scrubbing operation, to effect substantially complete removal of the silane in the gas stream being treated.

With respect to foaming behavior that may occur in the scrubber, the present invention in another embodiment contemplates the utilization of means to inhibit foam formation, e.g., that may arise as a result of materials such as tetraethylorthosilicate (TEOS) or chlorinated silanes that may be present in the gas stream being treated, and which in the scrubbing liquid environment may be rise to substantial foam formation. In one embodiment of the invention, an antifoaming agent may be injected into the scrubber. In another embodiment, physical modifications are made to the exhaust lines of the recirculation pump associated with the scrubber in order to reduce the flow rate and pressure at which the recirculated scrubbing liquor is introduced over the packing of the scrubbing column. Specifically, an orifice plate may be provided in the recirculation pump discharge line to reduce the flow rate and pressure of the recirculating liquid. Such orifice plate also creates back-pressure on the pump, reducing or eliminating the occurrence of incipient bubbling or cavitation that can lead to foaming in certain instances, especially when TEOS, or halogenated silanes, is present.

Figure 7:
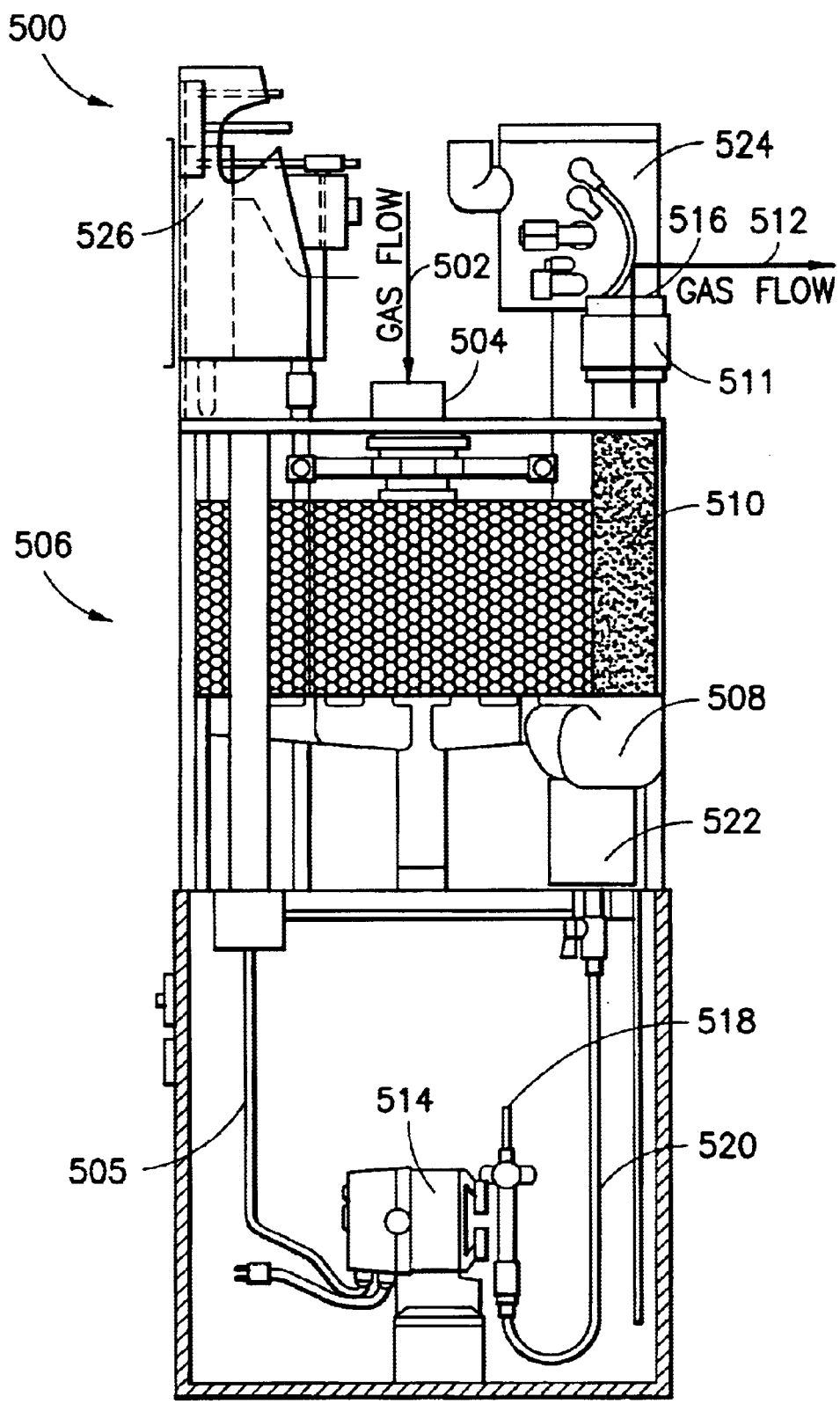
FIG. 7 is a schematic elevation view of a water scrubber apparatus according to another embodiment of the invention.

More specifically, an antifoam chemical additive can be added to the water scrubber by a chemical injection unit of the type shown in FIG. 7.

FIG. 7 shows a water scrubber 500 to which a gas stream is introduced in line 502 to the inlet structure 504 depicted schematically in the drawing figure. The gas stream is scrubbed with an aqueous scrubbing medium in scrubber chamber 506 from which the scrubbed gas stream is discharged in discharge conduit 508, optionally passing through the post scrubber unit 510 and being finally discharged from the scrubber system discharge port 511 in line 512. The scrubber system comprises a scrubbing liquid recirculation pump 514 receiving influent scrubbing liquid from line 505 and discharging effluent and recirculation scrubbing medium in discharge line 518. The chemical injection agent is flowed from the chemical injection tube 522 of the chemical injection unit 524 to the recirculation pump 514 via line 520. Make-up scrubbing liquid is flowed to the post scrubber unit 510 via feed line 516. A control module 526 comprising suitable monitoring, sensing, instrumentation, computation, adjustment and actuation means, controls the scrubber system and the chemical injection unit.

The chemical injection system 524 may be used to inject the antifoam chemical agent. The antifoam agent used is of a suitable type and is added in a concentration that modifies the surface tension of the scrubbing liquor so that foaming is inhibited. Examples of antifoam materials that may be usefully employed in the broad practice of the invention include Antifoams 1410 and 1430 commercially available from Dow Corning Corporation, which are silicone-based materials. Such silicone antifoam materials may be used at a concentration of between about 1 and about 100 ppm (by weight) of active silicone in the aqueous scrubbing medium. The antifoam concentration may be readily determined in a specific application by varying the dosage of the antifoam to the scrubbing medium and monitoring the foaming action in the scrubber.

Another method for reducing foaming is to modify the plumbing on the pump recirculation line. For example, a restrictive flow orifice may be placed in the pump recirculation line, to reduce or eliminate foam formation. Such orifice decreases the recirculation liquor flow rate, so that less scrubbing liquor impinges on the packing surfaces in the scrubber chamber over time, and the orifice also functions as a pressure drop device. This effectively reduces the pressure at which the scrubbing liquor exits the spray nozzles above the packed column.

In this approach, the restrictive flow orifice decreases the mechanical agitation of the fluid (scrubbing liquor) in the system at various possible system locations, e.g., (i) at the spray nozzles, due to lower pressure drop across them; (ii) at the packing surface, due to lower momentum transfer upon liquor impingement; and (iii) inside the pump, due to the lower liquor flow rate that passes through the pump. It also creates backpressure on the pump, reducing or eliminating the occurrence of incipient bubbling or cavitation that can lead to foaming in certain instances, especially when TEOS, or halogenated silanes, is present.

Various approaches may be used to alleviate the $CaCO_3$ deposition problem in the effluent treatment system. One approach utilizes a magnetization technique in which the make-up water is passed through a magnet. A second approach uses a pH control system. A third approach uses a lime-soda ash column to treat (soften) the make-up water. A fourth approach is to precipitate the solids upstream to the scrubber.

The use of lime-soda ash to soften water is more fully described in Pontius, F. W. *"Water Quality and Treatment"*, 4th Ed., McGraw-Hill 1990, p. 359, which describes hardness as being principally caused by calcium and magnesium ions that exist as soluble chemical species [for example, $Ca(HCO_2)_2$ and $Mg(HCO_3)_2$] in hard groundwater. By lime-soda ash softening, such soluble chemical species are converted to insoluble precipitates of calcium carbonate [$CaCO_3(s)$] and magnesium hydroxide [$Mg(OH)_2(s)$].

The calcium carbonate precipitation problem is usually encountered when two factors are simultaneously present. The first is that the local water contains large amounts of dissolved calcium. The second is that the gas stream being treated contains ammonia, which raises the pH in the scrubbing liquor. Such increase in pH in turn causes the dissolved calcium to precipitate as calcium carbonate.

In one embodiment, the formation of calcium carbonate formation in the scrubbing system is prevented by passing the make-up water through a magnet. The magnet serves to align the calcium carbonate ions and particles prior to their entering the scrubber. The ions and particles thereby align themselves such that they are electrically inhibited from adhering to surfaces within the scrubber chamber. Magnetization means are known in the art and such means may be adapted for effluent gas scrubbing systems in accordance with the present invention, to prevent deposition in the scrubbing liquid of calcium carbonate or other deposition species whose deposition may be restricted or prevented by passage of the scrubbing liquid, e.g., water, through a magnetization zone.

Figure 8:
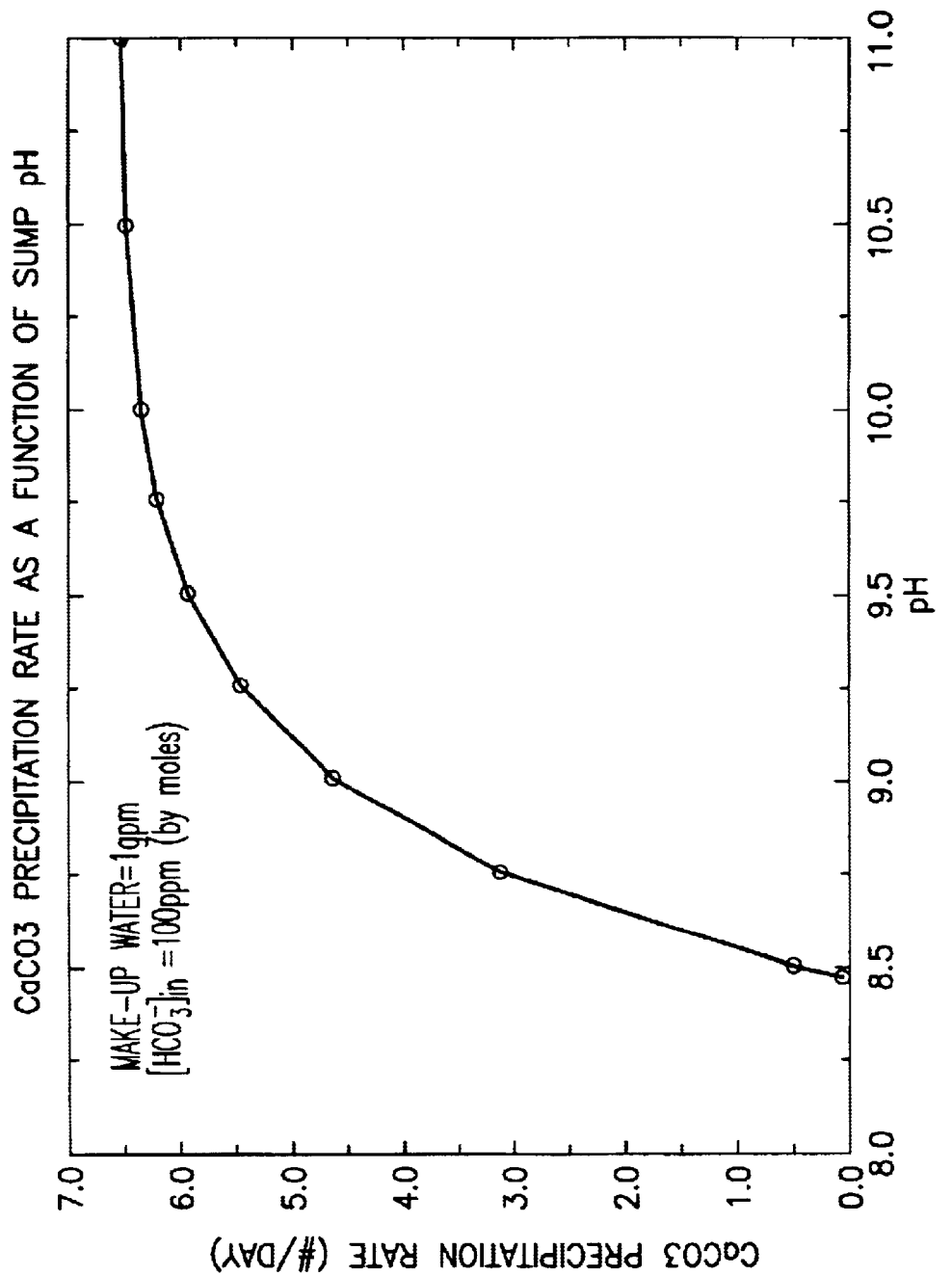
FIG. 8 is a graph of calcium carbonate precipitation rate, in pounds per day, as a function of pH of the water used for scrubbing in a water scrubber apparatus.

In another embodiment, the formation of calcium carbonate in the scrubbing system is prevented by controlling the pH of the scrubbing liquor solution. As can be seen in FIG. 8, which is a graph of $CaCO_3$ precipitation as a function of sump pH (of the scrubbing medium liquor in the sump tank of the scrubber unit), $CaCO_3$ will not precipitate if the scrubbing liquor is maintained below a pH of about 8.5.

Figure 9:
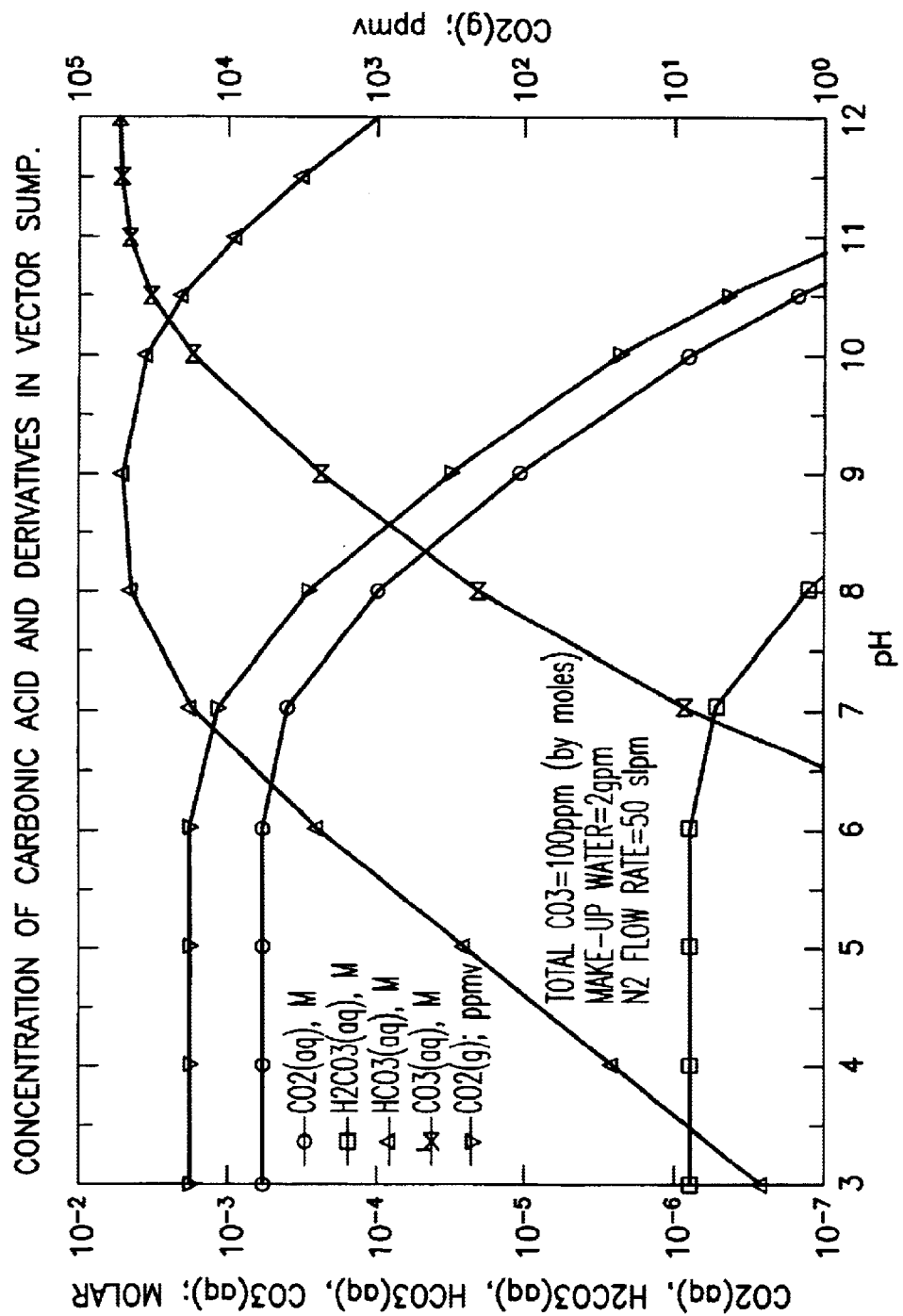
FIG. 9 is a graph of concentration of carbonic acid and derivatives thereof in the sump of a water scrubber apparatus, as a function of pH of the scrubbing liquid.

Instead, $Ca(HCO_3)_2$ (calcium bicarbonate) is formed, as shown in FIG. 9, which is a graph of molar concentration of $CO_2$ (aqueous), $H_2CO_3$ (aqueous), $HCO_3^-$ (aqueous) and $CO_3^{2-}$ (aqueous), as a function of pH of the sump liquor. $Ca(HCO_3)_2$ is quite soluble in water and therefore does not precipitate. In order to control the pH, the integrated chemical injection system of the scrubber system may be used (see FIG. 7). Any suitable chemicals may be used to control the pH level, including for example acids such as sulfuric acid ($H_2SO_4$) and hydrochloric acid (HCl).

In another embodiment, calcium carbonate deposition may be prevented by removing calcium from the scrubbing medium upstream of the scrubbing unit. For example, the make-up water for the scrubber unit may be passed through a column containing lime and soda ash. When passed through the column, the calcium precipitates as $CaCO_3$.

In still another embodiment, the deposition of calcium carbonate is prevented by precipitating or flocculating the calcium, by passing the make-up water through a flocculation chamber. Inside this chamber, a chemical additive such as sodium fluoride is used to precipitate the calcium as insoluble $CaF_2$. Alternatively, a flocculation method may be carried out using sodium hydroxide to raise the pH while simultaneously passing $CO_2$ gas into the chamber. The $CO_2$ gas is converted to $CO_3^{2-}$ ions in the basic solution, and the calcium then complexes with the $CO_3^{2-}$ to form the solid, $CaCO_3$.

Concerning the aforementioned problem of solids formation and occlusion in pressure sensing ports of the scrubber system, a small purge of inert gas such as nitrogen may be employed to maintain the pressure sensing ports free of solids deposits, by flowing the inert gas at suitable pressure and flow rate through the pressure sensing ports. This purge must be low enough so that back-pressure is not imposed on the pressure sensing device, since this will cause an inaccurate pressure reading. The purge gas flow must however be large enough to combat any diffusion of condensable gases that are present, or passage of particulates into the pressure sensing port. The inert purge gas can also be heated when condensable gases are present, as this will further inhibit solids formation at the port.

It is also desirable to minimize the occurrence of solids in the inlet to the scrubber system. Heating the inlet gas delivery tube is helpful in this respect, since it assists in maintaining all condensable gases in the vapor phase until the gases enter the scrubber.

Another aspect of the invention relates to a two-stage scrubber system, which resolves the problems of single scrubber units encountered in prior art effluent gas treatment systems. The two-stage scrubber system of the invention includes an equilibrium column followed by a mass transfer column. The equilibrium column permits an extremely close approach to equilibrium and ideal Henry's Law behavior, but in a very short column. The subsequent mass transfer column provides additional scrubbing efficiency above the level limited by Henry's Law in the first column. If one were simply to use a cocurrent equilibrium column, one could never achieve the high efficiencies at low water flow rates that can be obtained with a counter-current flow column. Nonetheless, with a counter-current flow column, the column height requirement is significantly above that permitted in industrial facilities such as semiconductor fabs, i.e., the column would be taller than could be accommodated in such facilities.

By utilizing an equilibrium column followed by a mass transfer column, acceptable overall column heights and superior efficiency of effluent abatement are achieved at low water usage. This is a significant advance in the art, as regards such two-stage scrubber system of the invention.

Additionally, the two-stage scrubber system of the invention is highly advantageous for particulate and deposition elimination in the treatment of the effluent gas stream. The equilibrium column has a large water flow rate and a "wide-open" barrel conformation, to provide effective washing performance in the initial gas scrubbing operation. The second scrubber unit's mass-transfer column has a relatively much smaller diameter and relatively substantially lower water flow rate than the first scrubber unit. Such smaller diameter/flower water flow rate characteristic by itself would normally indicate that the column would be highly susceptible to clogging in use, but this is avoided in the two-stage scrubber system of the invention due to the fact that the mass transfer column is protected by the upstream equilibrium column.

The two-stage scrubber system of the invention thus includes a first scrubber stage that comprises a packed column, in which effluent gas is flowed cocurrently through the column with the scrubbing medium, e.g., in a downward direction. Slightly above the packed column a recirculating means such as a rotating spray hub may be provided, whereby water from the sump at the bottom of the scrubber is recirculated at a very high rate. This column serves to remove a large portion of the acid gases and water-scrubbable gases other than acid gases, and it also removes many of the solids that are either present in the incoming gas stream or are formed due to reaction of incoming gases with the water in the scrubber.

The removal efficiency of the scrubber first stage for removal of a given gas species will depend on its flow rate and the make-up water flow rate, which can be readily determined without undue experimentation by varying the respective flow rates and determining the rate and extent of removal, to determine the gas and scrubbing liquid flow rates that will provide the desired efficiency for the scrubber first stage unit.

From the first stage scrubber unit, the partially treated gas flows to a second stage water scrubber where the concentrations of the undesired component(s) are further lowered.

This so-called "polishing" column is a vertical column in which the gas passes through in a counter-current fashion. This column is typically much smaller than the first stage column. The smaller column size enables proper wetting of the packing with a much lower water flow rate as compared to the first stage column. The required water flow rate is low enough so that fresh make-up water can be used for this purpose. The efficiency of the column is therefore high and allows the 2-stage scrubber system to operate without using chemical injection agents or large amounts of fresh water.

There are a few ways to examine the advantages resulting from the use of a 2-stage water scrubber as compared to a conventional single stage water scrubber. For a given make-up water flow rate, the 2-stage design will enable significantly higher scrubbing efficiencies. On the other hand, if a given efficiency is required, the 2-stage design allows for a significant reduction in the make-up water flow rate. Finally, the 2-stage arrangement allows the scrubber system to accept a higher gas challenge while maintaining the same efficiency and make-up water flow rate as compared to a single stage scrubber system.

In the 2-stage scrubber system, the second stage simultaneously enables an increase in scrubbing efficiency while using a smaller flow rate of make-up water compared to a single stage scrubber design. Use of the polishing scrubber can obviate the need for chemical injection agents that would typically be required in order to achieve the efficiency results that readily are accomplished in the 2-stage scrubber system.

In a representative comparison, of a prior art single-stage scrubber system, and a two-stage water scrubber system of the present invention, for scrubbing of fluorine gas, a nitrogen flow containing fluorine was treated by water scrubbing in the respective systems. The resulting performance data are shown in Table B below.

TABLE B

| Make-up Water (GPM) | Total N2 (slpm) | Chem inject? | F2 inlet (slpm) | Equivalent Outlet (HF) (ppm) |
|---|---|---|---|---|
| Single-Stage Water Scrubber | | | | |
| 1.2 | 80 | no | 0.5 | 10.5 |
| 1.2 | 80 | yes | 0.5 | 6.9.5 |
| 0.5 | 80 | yes | 3.0 | 745.5 |
| Two-Stage Water Scrubber | | | | |
| 0.75 | 80 | no | 0.5 | 4.2 |
| 0.75 | 80 | no | 1.0 | 8.4 |
| 0.75 | 80 | yes | 2.25 | 2.5 |
| 0.75 | 230 | yes | 3.0 | 42.8 |
| 0.75 | 230 | yes | 5.0 | 98 |

The foregoing data show the improvement of fluorine abatement and low water consumption requirements achieved by the two-stage water scrubber system.

In a specific embodiment, the first stage of the 2-stage scrubber system comprises a packed column with a diameter of 21" and a height of 18", through which semiconductor process tool exhaust gases pass in a co-current fashion. The second stage column may have a diameter of 4" and a height of 18", permitting a much lower water flow rate to be used for scrubbing as compared to the first stage column. This design is such that proper wetting of the packing can be achieved with a water flow rate of <0.5 GPM; fresh make-up water can therefore be used for this purpose.

In a specific embodiment, a novel column wall liner may be employed in the (second) polishing scrubber, which helps to increase the polishing scrubber's effectiveness. The liner also acts as a sock that contains the packing material of the polishing scrubber. Such design feature allows the polishing scrubber to be easily removed and replaced if cleaning is necessary. Additionally, the design allows the polishing scrubber to be easily retrofitted to existing single scrubber systems in the field.

Figure 10:
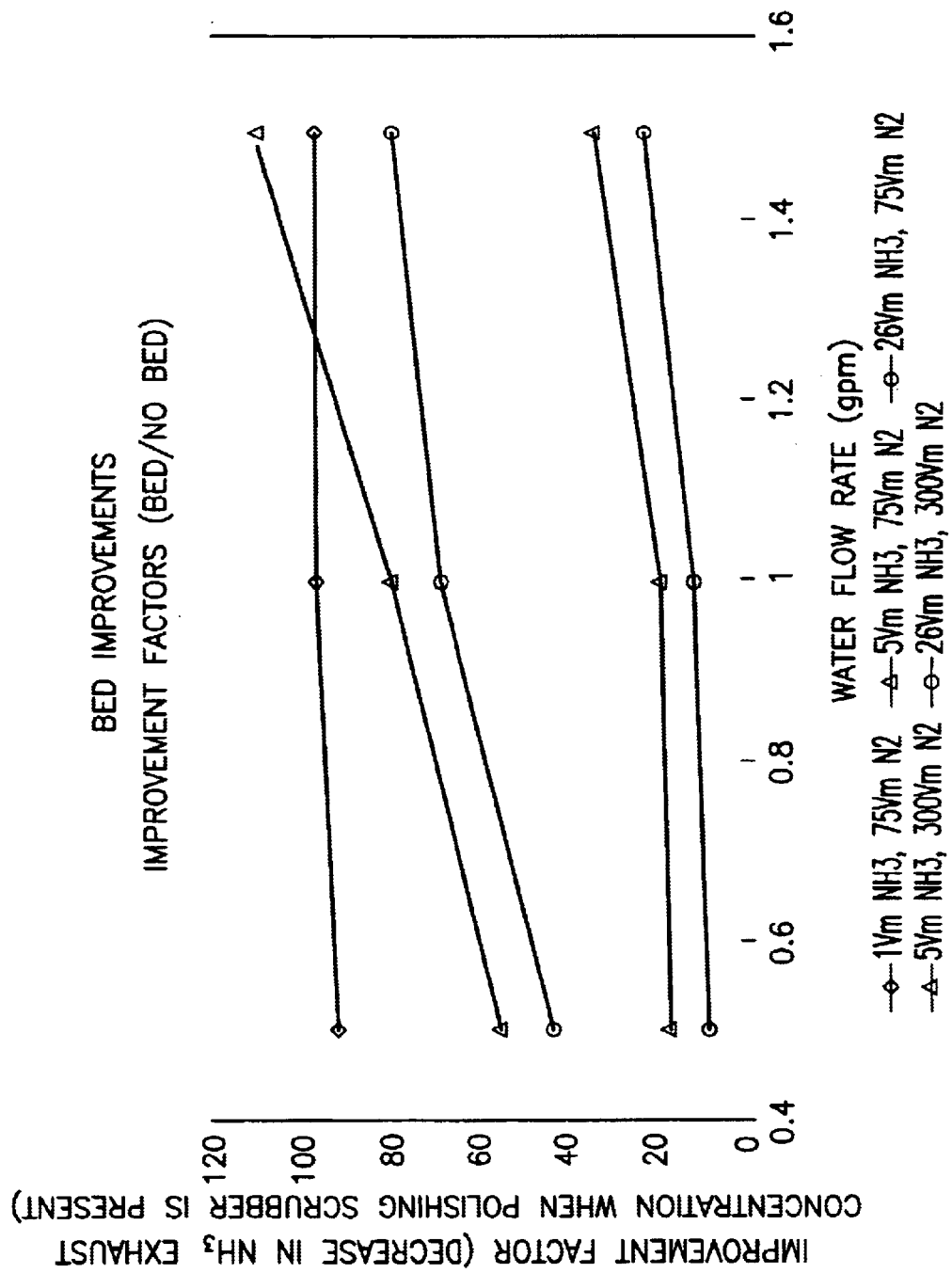
FIG. 10 is a graph of improvement factor (decrease in ammonia exhaust concentration when a second-stage scrubber is employed, relative to a conventional single-stage scrubber) as a function of water flow rate, and various ammonia flow rates.

FIG. 10 is a graph of improvement factor for the decrease of ammonia exhaust concentration when the polishing scrubber is used (in comparison to a corresponding system lacking the polishing scrubber), as a function of water flow rate, in gallons per minute. The graph shows that the polishing scrubber decreases the $NH_3$ outlet concentration up to 110 times (in relation to a corresponding scrubber system wherein no polishing scrubber is present) for a given make-up water flow rate. Additionally, the polishing scrubber can decrease the $NH_3$ outlet concentration up to a factor of 30 while using only ⅓ of the make-up water of a corresponding single stage scrubber system.

A highly advantageous optional design feature of the polishing scrubber is a wall liner. The polishing scrubber may by way of example be 4" in diameter while the diameter of the packing material elements used in such polishing scrubber is 1". The column diameter to packing diameter ratio is thus equal to 4. Conventionally employed design rules of thumb suggest that this ratio should never be less than 8 and preferably such ratio should be 10–15 at a minimum. The reason for this is that small ratios accentuate channeling of the scrubbing liquor down the column walls, since the void space at the wall is disproportionately large compared to the void spaces found in the column internal areas.

A wall liner may be used in the polishing column to hold the scrubber packing, while simultaneously inhibiting wall channeling and therefore achieving good scrubbing efficiencies. In this respect one cannot simply use smaller packing sizes to overcome the aforementioned channeling/bypassing phenomena, due to pressure drop limitations of the system.

The wall liner used in the broad practice of the invention comprises a bag, netting, basket, or other container that is foraminous, to readily allow flow therethrough of the gas being treated as well as the scrubbing liquid. In this manner, the liner is gas- and liquid- permeable, to allow gas/liquid contacting to take place on the surfaces of the packing inside the liner.

In one embodiment, the liner may be formed of an inert material, such as for example an inert polymer, such as polyethylene, polypropylene, polysulfone, polyvinylchloride, polycarbonate, etc., glass fiber, or any other material that is structurally suitable to form the liner and that is chemical non-active in the polishing scrubber with the materials that may be used therein.

By way of specific example, the liner may be formed of a plastic open mesh material, defined by plastic wire elements and having a 1 centimeter×1 centimeter mesh size characteristic, although mesh sizes smaller or larger will also work quite effectively, depending on the packing dimensions of the material that is used in the polishing scrubber to provide the extended mass transfer area for gas/liquid contacting. The thickness of the plastic wire is approximately ¹⁄₁₆" and the orientation of the mesh is such that the plastic wires run vertically and horizontally. The mesh may be varied in specific embodiments to include larger or smaller spacing between the plastic wires; to include thinner or thicker plastic wires; and/or to include a diagonally (any angle) oriented mesh in which the wires do not run vertical and horizontal. The material of which the mesh is made is preferably a chemically inert material that is hydrophobic, i.e., that does not wet well.

The wall liner thus provides a removable retention structure that contains the packing material of the polishing scrubber. Such plastic liner design is highly advantageous, since the packing liner can easily be removed when cleaning of the packing material and/or column interior surfaces is required. Retrofitting existing water scrubber units in the field is also facilitated with the liner design.

While the liner has been specifically described above in reference to the "polishing" or second stage scrubber in a 2-stage scrubber unit, it will be appreciated that a liner structure may also be used in the first stage scrubber unit. In the first stage unit, because of the size and dimensional character of the vessel providing the casing or housing of the unit, there is no packing size-mediated bypassing or channeling problem of the type encountered in the polishing stage, but there is a need to clean the interior surfaces of the first stage unit as well as the surfaces of the packing therein.

Accordingly, the packing in the first stage unit of the 2-stage scrubbing system may also be provided in a liner of similar type to that used in the second stage of the scrubber system.

The liner-contained packing therefore serves as a "cassette" that may be removably installed in the polishing scrubber and optionally the first stage scrubber of the invention to provide a highly effective operation of the scrubbing system, which avoids in application to the polishing scrubber the aforementioned wall effects of bypassing and channeling of gas.

Figure 11:
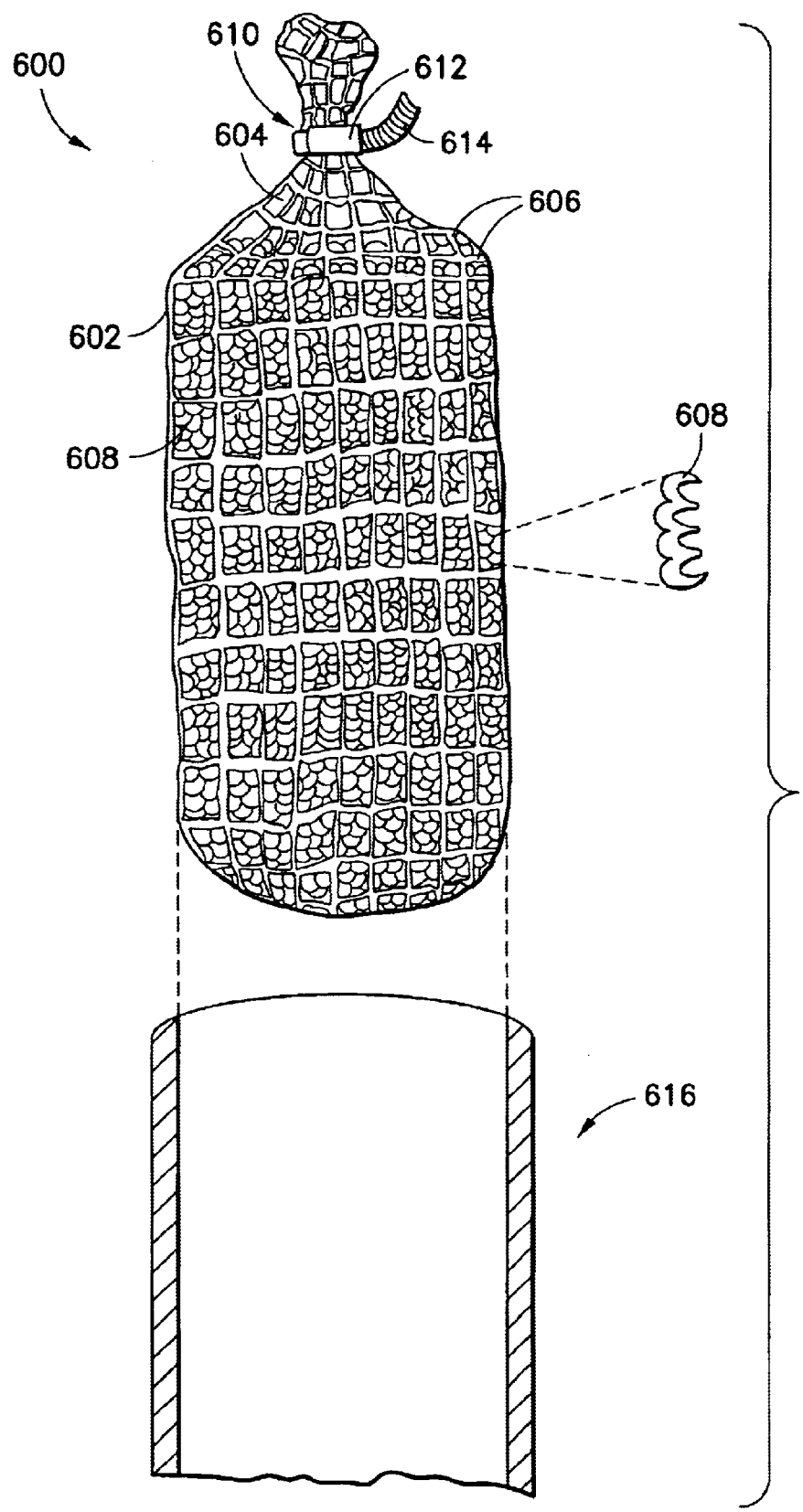
FIG. 11 is an exploded partial sectional elevation view of a mesh bag of scrubber particles, and an associated vessel casing of a scrubber unit receiving same, in accordance with one embodiment of the invention.

FIG. 11 is a schematic representation of a wall liner and packing assembly 600 according to one embodiment of the present invention, including a mesh bag 602 with openings 604 defined by crisscrossed strand elements 606 formed of a suitable polymeric material that retains its structural integrity under scrubbing conditions. The mesh bag 602 contains a mass of the packing elements 608. The mesh bag may as shown be provided with an upper end closure structure 610, such as a spring-biased clip 612 and belt 614 structure, so that the mesh bag can be readily manually be opened as well as closed, by latching or unlatching the spring clip, respectively.

The packing elements 608 may be of any suitable shape, size, form and material, as advantageous or useful in a given gas scrubbing application. For example, the packing elements may be of ring, saddle, spiral, doughnut, or other geometrically regular and/or irregular form, and may for example comprise Pall rings, Raschig rings, or any other commercially available packing material. The packing material preferably has a high surface to volume ratio characteristic, so that a highly efficient action in the gas/liquid contacting in the scrubbing operation is achieved.

The wall liner and packing assembly is shown in FIG. 11 in exploded relationship to an upper portion of a scrubbing unit vessel 616, in which such wall liner is removably installed.

Figure 12:
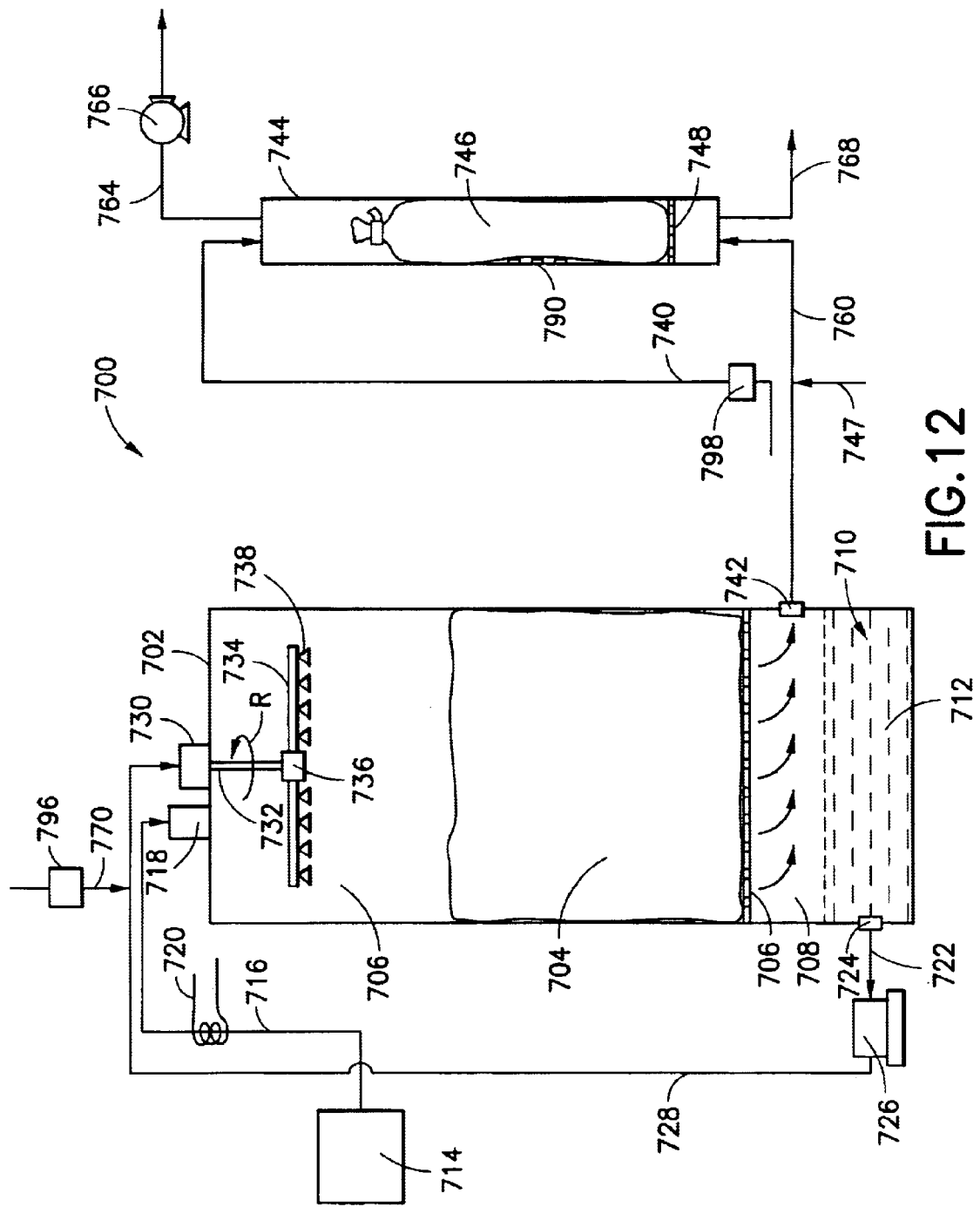
FIG. 12 is a schematic representation of a two-stage scrubber system according to one embodiment of the present invention.

FIG. 12 is a schematic representation of a 2-stage scrubber system 700 according to one embodiment of the present invention.

The 2-stage scrubber system comprises a first scrubber vessel 702 enclosing an interior volume containing a bed 704 of scrubber medium. Although shown in a preferred form as a "loose" bed of packing material, it is also contemplated that the bed could be provided as a removable insert forming a bed of packing material for gas/liquid contacting. The bed 704 is disposed on a support 706 which may comprise a grid, mesh, screen or other suitable foraminous member that is secured to the inner wall of the vessel 702 and is structurally strong enough to support the bed of packing material. Typically, the first scrubber vessel will contain a bed of packing material without any liner or bag therefor.

Above the bed of packing material 704 is a head space 706 that receives the gas to be treated from the upstream process facility 714 such as a semiconductor processing plant, from which the effluent gas is flowed in line 716 to the scrubber vessel 702 and introduced into the interior volume of the vessel by inlet device 718. The effluent gas may in its flow through line 716 be heated by heating element 720, e.g., in order to abate silane more effectively.

By this arrangement, the gas from the upstream facility is flowed downwardly through the bed of packing material, to a lower plenum space 708, and is discharged from the scrubber vessel 702 into line 760. The discharge line 760 is joined to the wall of the scrubber vessel 702 by fitting 742.

The plenum space 708 also defines a sump 710 for collection of liquid scrubbing medium 712, e.g., an aqueous medium. From the sump 710, liquid is recirculated by means of line 722 joined to the wall of vessel 702 by fitting 724. Line 722 flows the scrubbing liquid to the pump 726, which discharges the liquid into recycle line 728, from which it is flowed into the drive module 730 which is drivingly coupled to hollow shaft 732 joined in turn to hub 736 having arms 734 equipped with spray nozzles 738 secured thereto. The drive module thus flows scrubbing liquid from line 728, augmented as necessary by make-up liquid from line 770 joined to a suitable source (not shown) of such liquid, through the hollow shaft 732 to the arms 734 and nozzles 738 for spray distribution over the bed of packing material in bag 704. The drive module concurrently rotates the shaft in the direction indicated in FIG. 12 by arrow R. If the polishing scrubber is present, make-up water preferably will flow exclusively to it, because this would provide the most optimal scrubbing potential; line 770 would contain the liquid discharge from the polishing scrubber 768.

The make-up liquid in line 770 may optionally be passed through a magnetization zone 796, to prevent calcium carbonate deposition in the scrubber system. Alternatively, the zone 796 may comprise a pH adjustment zone, a lime-soda ash column for treatment (softening) of the scrubbing liquid, or a precipitation zone in which calcium and magnesium are precipitated out of the scrubbing liquid by appropriate treatment thereof, so that the scrubbing liquid is depleted in calcium and magnesium upstream of the scrubber chamber.

The liquid scrubbing medium thereby is flowed downwardly in the scrubbing vessel 702, in co-current flow relationship to the gas. In this manner, a large portion of the acid gases and water-scrubbable gases other than acid gases will be removed from the effluent gas being treated, and much of the solids in such gas will be concurrently removed by the scrubbing operation.

The effluent gas treated by scrubbing in the first scrubbing vessel 702 then is flowed in line 760 to the second scrubbing vessel 744. The second scrubbing vessel has a bag 746 therein containing a packing material, as described in connection with FIG. 11 herein.

It will be appreciated that the second scrubbing vessel 744 may be of a size and dimensional character that obviates the need for a bag 746 of the packing material, and that the bed in such instance may be formed of loose packing material. In instances such as those described above, however, where the bed is of a small diameter, the provision of a bag as shown serves to provide a wall-contacting structure that avoids anomalous bypassing and channeling behavior that would otherwise result in inadequate scrubbing treatment of the gas, and produces appropriate hydrodynamic behavior that ensures a high efficiency in the polishing scrubbing operation.

The bag 746 of packing material in the second scrubbing vessel is reposed on a support structure 748 that may be of a same or similar type to that used in the first scrubbing vessel. Fresh scrubbing liquid is introduced to an upper portion of the scrubbing vessel 744 in line 740, which may be joined to a suitable source of scrubbing liquid (not shown). The scrubbing liquid in line 740 may optionally be flowed through a magnetization zone 798, to suppress or eliminate the deposition of calcium carbonate in the scrubbing system.

Alternatively, the zone 798 may comprise a pH adjustment zone, a lime-soda ash column for treatment (softening) of the scrubbing liquid, or a precipitation zone in which calcium and magnesium are precipitated out of the scrubbing liquid by appropriate treatment thereof, so that the scrubbing liquid is depleted in calcium and magnesium upstream of the scrubber chamber.

The scrubbing liquid may be distributed in the upper interior volume of the second scrubbing vessel by a distribution means such as that shown in connection with the first vessel, but the diameter of the second vessel generally is sufficiently small that a single spray head or nozzle is adequate for liquid introduction purposes, across the full transverse cross-section of the vessel.

The scrubbing liquid then flows downwardly through the packing in the bag 746 and is contacted with the gas introduced to the vessel 744 from line 760. The gas from line 760 thus is introduced in a lower portion of the vessel interior volume and flows upwardly through the packing material in bag 746 to effect intimate gas/liquid contacting for scrubbing of the gas.

The scrubbed gas thus passes to the upper portion of the interior volume of the vessel 744 and is discharged into line 764 containing blower 766, to effect egress of the treated gas from the system and to overcome the upstream pressure drop associated with the processing of the gas. Alternatively, a pump, compressor, turbine, fan, ejector, eductor or other motive flow means may be employed to effect the discharge of the gas from the treatment system.

The scrubbing liquid after passage through the bed of packing material is discharged from the lower portion of the vessel 744 in line 768, and may be further treated before final disposition, and/or recirculated in the system, e.g., as make-up flowed to line 770 for subsequent introduction into first scrubber vessel 702.

The optional magnetization zones 796 and 798 may include therein any suitable magnetization apparatus, such as for example the C-500 Physical Water Conditioner (Isaacson Enterprise, Stockton, Calif.) and magnetization systems commercialized by SoPhTec International (Costa Mesa, Calif.) under the trademark SoPhTec.

The 2-stage scrubbing system described above is highly advantageous in terms of minimizing the amount of clean water that is utilized in the scrubbing treatment of the gas. Further, the system involving multiple scrubbing steps obviates the need for chemical treatment, and thus achieves a significant advance in the art, in enabling efficient scrubbing treatment to be carried out without significant water requirements and without high operating costs that are otherwise associated with chemical usage.

As another approach that may be employed in lieu of or addition to the use of a bag containing the packing material in small diameter scrubbers for attenuating bypassing or channeling behavior incident to wall effects, it may be desirable in some instances to provide on at least a portion of the interior wall surface of the scrubbing vessel a fluid flow disrupter structure, such as projections 790 shown on the interior wall of the scrubber vessel 744 in FIG. 12. The flow disrupter structure may be in any suitable form, such as for example, bars, bumps, protuberances, hooks, integrally formed wall projections (such as may be formed, for example, by knurling the interior wall surfaces), ribs, scoring of the wall, grit embedded in the wall, metal appliques brazed or welded to the interior structure, fibers or rods attached to the wall surface, etc. Such disrupter structure will alter the boundary layer of the fluid flow at the wall of the scrubber vessel and redirect the fluid flow stream at the wall back into the bulk volume of the bed.

As a further aspect of the system of FIG. 12, the effluent gas stream flowed from the first scrubber unit 702 to the second scrubber unit 744 in line 760 may have clean dry air or other suitable gas introduced thereto from line 747. Such introduction of clean dry air may be advantageous in abatement of undesirable components of the effluent gas stream such as silane, particularly when present with ammonia in the gas stream. For such purpose, line 747 may be joined to a source (not shown) of clean dry air, or other suitable gas for such purpose.

It will be appreciated that although a 2-stage embodiment of the scrubbing system has been shown and described, other embodiments of the invention may be employed wherein more than one scrubbing vessel and associated scrubbing steps are provided.

Figure 13:
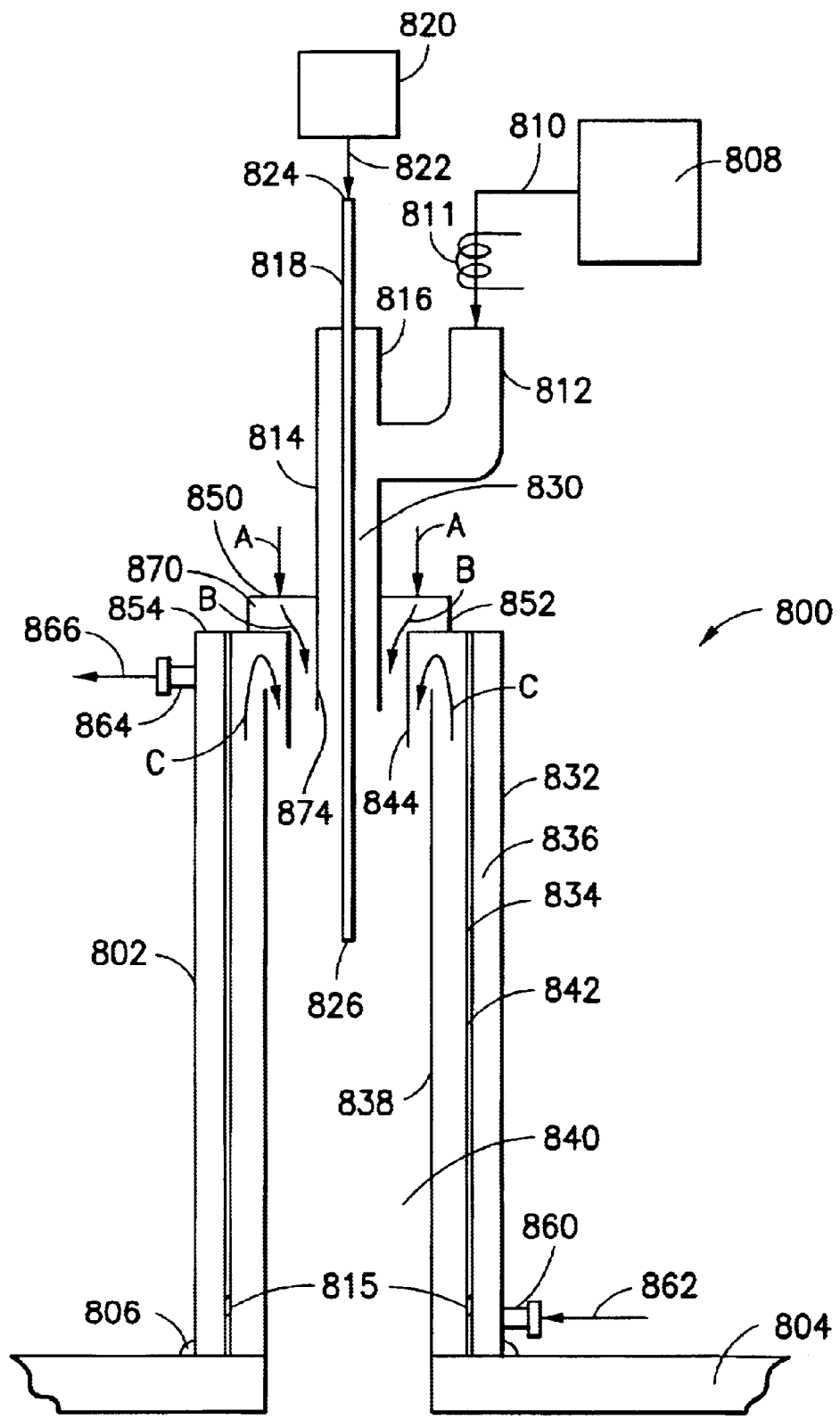
FIG. 13 is a sectional elevation view of an inlet structure according to a further embodiment of the invention.

FIG. 13 is a sectional elevation view of an inlet structure 800 according to another embodiment of the present invention.

As shown, the inlet structure 800 includes a housing 802 having a outer wall 832 that is preferably of cylindrical form, and which is in radially-spaced relationship to intermediate cylindrical wall 834, to define an annular volume 836 therebetween. The outer wall is provided with an inlet port 860, which is provided with cooling water in line 862 from a suitable source of same (not shown). The outer wall 832 also is provided with an outlet port 864, by means of which water that is circulated in the interior volume 836 may be discharged in line 866.

By this arrangement, cooling water can be introduced to the annular interior volume 836 for circulation therethrough and discharged to maintain a predetermined temperature in the inlet structure.

Although described above as cooling water, it will be appreciated that heating water may be similarly introduced in the event that heating of the inlet structure is desired, and liquids other than water may be employed as a heat transfer medium in this manner.

As shown, the intermediate wall 834 may be provided with wall openings 815 through which cooling water may be flowed into the annular volume 842 between the intermediate wall 834 and inter wall 838. The inter wall 838 extends upwardly and terminates below the top wall 854 bounding the annular volumes 836 and 842, whereby the liquid introduced into annular volume 842 may overflow the upper extremity of wall 838, flowing in the direction indicated by arrow C, to form a falling film on the interior surface of wall 838 bounding the gas flow path 840. As an alternative to such wall openings 815, intermediate wall 834 may be formed of a porous material to allow liquid permeation therethrough. As a still further alternative, water or other liquid may be independently provided to the annular volume 842 by a separate liquid inlet or port (not shown).

To channel the overflow liquid downwardly along the inner surface of wall 838, a downwardly depending flange wall 844 is provided and extends downwardly from top wall 854.

The top wall 854 in turn supports an upwardly extending cylindrical wall 852 which is closed at its upper end by top wall 850, thereby forming an interior plenum space 870, to which air, nitrogen or other gas can be introduced in the direction indicated by arrow A, to enter the plenum space 870 and flow in the direction indicated by arrow B into the gas flow path 840. Preferably such introduced gas is clean dry air.

The top wall 850 in turn circumscribes an inlet conduit 814, having a side arm 812 receiving process gas in line 810 from an upstream source 808 such as a semiconductor-manufacturing tool. Such process gas, containing components to be abated, enters the inlet conduit 814 in side arm 812 and flows therefrom to the main central section 816 enclosing interior volume 830. A vertically extending tube 818 extends through the interior volume 830 to a lower end 826 disposed in gas flow path 840. The tube 818 is circumscribed by the wall surface 874 of inlet conduit 814.

The upper end 824 of tube 818 is joined by line 822 to a source 820 of clean dry air or other suitable gas.

By the arrangement shown, the effluent gas entering in line 810 and flowing through inlet conduit 814 passes through interior volume 830 of the inlet conduit and is discharged at the lower end thereof for flow downwardly in the gas flow path 840. The gas flowing in line 810 may be optionally heated if desired by the heating element 811 arranged to heat the line 810.

Concurrently, liquid overflows the upper end of inner wall 838 and forms a downwardly flowing film of liquid on the inner surface of wall 838 bounding the gas flow path. Also concurrently, clean dry air or other gas is introduced into plenum space 870 as well as into tube 818, to shroud the wall surfaces of the inlet structure from contact with the effluent gas, while at the same time mixing the effluent gas with the clean dry air or other gas, which may be useful in the abatement of specific undesired components in the effluent gas stream. For example, the clean dry air introduced into plenum space 870 and tube 818 may be introduced in an amount and at a rate which will serve to substantially abate the silane content of the effluent gas. As another optional feature, the inlet conduit 814 may be heated by suitable means (not shown).

The effluent gas thus flows downwardly in the gas flow path 840 of the inlet and passes downwardly to the scrubber 804, wherein gas/liquid contacting may be carried out to effect further and specific abatement of components in the effluent gas stream.

The inlet housing 802 may be secured to the scrubber 804 by welds 806, or by other affixation or securement means or method, e.g., a coupling, clamp, fitting, etc.

The present invention provides in various aspects a scrubbing system: utilizing a reducing agent to enhance scrubbing efficiency of HF and $F_2$, as well as other halocompound, e.g., fluorocompound, gases, while inhibiting the formation of deleterious species such as OF2; that is readily arranged to destroy silane gas species; that minimizes the incidence and extent of foaming in the scrubbing operation; that is suitably arranged to prevent calcium carbonate deposition and occlusions of pressure sensing ports, as well as the formation of other solids in the scrubbing system; comprising a multiple stage scrubbing arrangement that is effective to markedly reduce water requirements for the scrubbing operation, as well as obviating or at least substantially reducing chemical requirements; and using a scrubbing packing material in a containment structure that is useful in small-diameter scrubbing columns to avoid bypassing and channeling behavior, and achieve high gas/liquid contacting efficiency.

While the invention has been described herein with reference to specific embodiments and features, it will be appreciated the utility of the invention is not thus limited, but encompasses other variations, modifications, and alternative embodiments. The invention is, accordingly, to be broadly construed as comprehending all such alternative variations, modifications, and other embodiments within its spirit and scope, consistent with the following claims.

What is claimed is:

1. A scrubbing process for the abatement of a gas component in a gas stream containing same, said scrubbing process comprising introducing the gas stream and a scrubbing liquid to a first gas/liquid contacting chamber and effecting gas/liquid contacting therein, wherein said process additionally comprises flowing the effluent gas from the first contacting chamber to a second gas/liquid contacting chamber and introducing to said second contacting chamber a second scrubbing liquid for gas/liquid contacting therein, wherein the first gas/liquid contacting in the first chamber comprises cocurrent flow of the gas stream and scrubbing liquid and wherein the second gas/liquid contacting in the second contacting chamber comprises countercurrent flow of the gas stream and the second scrubbing liquid through the second contacting chamber, wherein said second contacting chamber has a smaller diameter than that of said first contacting chamber, and wherein the second contacting chamber has a lower water flow rate than the first contacting chamber.

2. A scrubbing process for treatment of an effluent gas including acid gas components and water-scrubbable components other than acid gas component, said process comprising:

scrubbing the effluent gas with a neutral aqueous scrubbing liquid in a first scrubbing zone to remove the acid gas components of the effluent gas, with co-current flow contacting of the aqueous scrubbing liquid and effluent gas with one another to yield effluent gas reduced in acid gas components;

flowing the effluent gas reduced in acid gas components from the first scrubber unit to a second scrubber unit; and scrubbing the effluent gas with a second aqueous scrubbing liquid in the second scrubbing zone to remove water-scrubbable components other than acid gas component from the effluent gas, with counter-current flow contacting of the second aqueous scrubbing liquid and effluent gas with one another to yield effluent gas reduced in acid gas components and water-scrubbable components other than acid gas components, wherein said second scrubbing zone has a smaller diameter than that of said first scrubbing zone, and wherein the second scrubbing zone has a lower water flow rate than the first scrubbing zone chamber.

3. The process according to claim 2, wherein the first scrubbing zone is a vessel enclosing an interior volume containing a bed of packing medium.

4. The process according to claim 2 wherein the scrubbing liquid in the second scrubbing zone contains no chemical injection agent.

5. The process according to claim 1 wherein the scrubbing liquid in the first contacting chamber and second chamber is water.

6. The process according to claim 1 wherein the first scrubbing liquid contains no chemical injection agent.

7. The process according to claim 1 wherein the second scrubbing liquid contains no chemical injection agent.

8. The process according to claim 1 wherein the diameter of the second contacting chamber is 0.19 the diameter of the first contacting chamber.

9. The process according to claim 2 wherein the diameter of the second scrubbing zone is 0.19 the diameter of the first scrubbing zone.

* * * * *